(12) United States Patent
Kim et al.

(10) Patent No.: US 12,376,327 B2
(45) Date of Patent: Jul. 29, 2025

(54) FIELD-EFFECT TRANSISTORS INCLUDING A LOWER INSULATING LAYER

(71) Applicant: Samsung Electronics Co., Ltd., Suwon-si (KR)

(72) Inventors: Jong Pil Kim, Seoul (KR); Wook Hyun Kwon, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 493 days.

(21) Appl. No.: 17/667,753

(22) Filed: Feb. 9, 2022

(65) Prior Publication Data
US 2022/0406939 A1 Dec. 22, 2022

(30) Foreign Application Priority Data

Jun. 21, 2021 (KR) .................. 10-2021-0079727

(51) Int. Cl.
*H10D 30/62* (2025.01)
*H10D 30/67* (2025.01)
(Continued)

(52) U.S. Cl.
CPC ..... *H10D 30/6211* (2025.01); *H10D 30/6219* (2025.01); *H10D 30/6735* (2025.01);
(Continued)

(58) Field of Classification Search
CPC ............. H01L 29/7851; H01L 29/0673; H01L 29/41791; H01L 29/42392; H01L 29/78696; H01L 29/0847; H01L 21/823481; H01L 27/088; H01L 29/1079; H01L 21/845; H01L 27/1211; H01L 29/66439; H01L 29/775; H01L 21/84; H01L 29/0649; H01L 29/78603; H01L 23/147; H01L 27/016; H01L 27/07; H01L 27/04; H01L 27/12; H01L 21/02126–02164;
(Continued)

(56) References Cited

U.S. PATENT DOCUMENTS 9,704,995 B1 7/2017 Schultz
9,893,161 B2 2/2018 Nakamura et al.
(Continued)

FOREIGN PATENT DOCUMENTS

KR 20040029582 A 4/2004

*Primary Examiner* — Dale E Page
*Assistant Examiner* — Douglas Yap
(74) *Attorney, Agent, or Firm* — Myers Bigel, P.A.

(57) ABSTRACT

The present disclosure provides a semiconductor device with improved element performance and reliability. The semiconductor device includes a lower insulating layer, a fin-shaped insulating layer that is on the lower insulating layer and extends in a first direction, a field insulating layer that is on the lower insulating layer and extends in the first direction, a plurality of gate structures that are on the fin-shaped insulating layer and include a gate electrode intersecting the fin-shaped insulating layer, a source/drain region that is on the fin-shaped insulating layer and is between the gate structures, and an active pattern that is on the fin-shaped insulating layer and penetrates the gate electrode and is electrically connected to the source/drain region, where the gate electrode extends in a second direction intersecting the first direction.

20 Claims, 36 Drawing Sheets

(51) Int. Cl.
  *H10D 62/10* (2025.01)
  *H10D 62/13* (2025.01)
  *H10D 62/17* (2025.01)
  *H10D 86/01* (2025.01)
(52) U.S. Cl.
  CPC ....... *H10D 30/6757* (2025.01); *H10D 62/121* (2025.01); *H10D 86/01* (2025.01); *H10D 86/011* (2025.01); *H10D 62/151* (2025.01); *H10D 62/364* (2025.01)
(58) Field of Classification Search
  CPC ......... H01L 21/02172–02192; H01L 29/0669; H01L 29/0676; H01L 29/0665; H01L 29/068; H01L 29/0843; H01L 29/1083; H01L 29/1087; B82Y 10/00; H01F 1/33
  See application file for complete search history.

(56) References Cited

U.S. PATENT DOCUMENTS

| | | |
|---|---|---|
| 9,991,261 B2 | 6/2018 | Mitard |
| 10,134,859 B1* | 11/2018 | Bi .................. H01L 21/823468 |
| 10,249,709 B2 | 4/2019 | Cheng et al. |
| 2017/0092728 A1* | 3/2017 | Kim ...................... H01L 29/785 |
| 2017/0309719 A1* | 10/2017 | Sun ...................... H01L 29/0653 |
| 2017/0365522 A1* | 12/2017 | Jeong ............. H01L 21/823431 |
| 2018/0366583 A1* | 12/2018 | Kim .................. H01L 29/0653 |
| 2019/0067435 A1 | 2/2019 | Badaroglu et al. |
| 2019/0148538 A1* | 5/2019 | Ryu ...................... H01L 23/5226 257/773 |
| 2019/0378834 A1* | 12/2019 | Penumatcha ..... H01L 29/78681 |
| 2020/0006575 A1* | 1/2020 | Dewey ................ H01L 29/7869 |
| 2021/0098631 A1* | 4/2021 | Fung ................ H01L 29/78603 |
| 2021/0202709 A1* | 7/2021 | Lee ................ H01L 29/4966 |
| 2021/0202742 A1* | 7/2021 | Huang .................. H01L 29/775 |
| 2021/0273098 A1* | 9/2021 | Chang ............ H01L 21/823814 |
| 2021/0376076 A1* | 12/2021 | Su .................... H01L 21/76897 |
| 2022/0069092 A1* | 3/2022 | Min ................ H01L 21/823878 |
| 2022/0181437 A1* | 6/2022 | Ohkawa ........... H01L 29/66795 |
| 2022/0223587 A1* | 7/2022 | Lin ................ H01L 21/823481 |
| 2022/0285531 A1* | 9/2022 | Hsu .................. H01L 29/0653 |
| 2023/0197856 A1* | 6/2023 | Chen ............ H01L 21/823807 257/295 |

* cited by examiner

FIELD-EFFECT TRANSISTORS INCLUDING A LOWER INSULATING LAYER

CROSS-REFERENCE TO RELATED APPLICATION

This application claims the benefit of Korean Patent Application No. 10-2021-0079727, filed on Jun. 21, 2021, in the Korean Intellectual Property Office, the disclosure of which is incorporated herein in its entirety by reference.

BACKGROUND

1. Field

The present disclosure relates to semiconductor devices.

2. Description of the Related Art

As one of the scaling techniques for increasing the density of a semiconductor device, a multi-gate transistor has been suggested. The multi-gate transistor is obtained by forming a fin- or nanowire-shaped multi-channel active pattern (or silicon body) on a substrate and forming gates on the surface of the multi-channel active pattern.

The multi-gate transistor can be easily scaled because it uses a three-dimensional (3D) channel. In addition, the current control capability of the multi-gate transistor can be improved without the need to increase the gate length of the multi-gate transistor. Moreover, it is possible to effectively suppress a short channel effect (SCE) in which an electric potential of a channel region is affected by a drain voltage.

Meanwhile, as the pitch size of a semiconductor device decreases, it may be helpful to conduct research to reduce capacitance and secure electrical stability between contacts in the semiconductor device.

SUMMARY

Aspects of the present disclosure provide a semiconductor device with improved element performance and reliability.

However, aspects of the present disclosure are not restricted to examples set forth herein. The above and other aspects of the present disclosure will become more apparent to one of ordinary skill in the art to which the present disclosure pertains by referencing the detailed description of the present disclosure given below.

According to an aspect of the present disclosure, there is provided a semiconductor device comprising, a lower insulating layer, a fin-shaped insulating layer that is on the lower insulating layer and extends in a first direction, a field insulating layer that is on the lower insulating layer and extends in the first direction, a plurality of gate structures that are on the fin-shaped insulating layer and include a gate electrode intersecting the fin-shaped insulating layer, a source/drain region that is on the fin-shaped insulating layer and is between the gate structures, and an active pattern that is on the fin-shaped insulating layer and penetrates the gate electrode and is electrically connected to the source/drain region, wherein the gate electrode extends in a second direction intersecting the first direction.

According to another aspect of the present disclosure, there is provided a semiconductor device comprising, an insulating layer, a trench that is in the insulating layer and extends in a first direction, a field insulating layer that is in the trench, a gate electrode that is on the insulating layer and extends in a second direction intersecting the first direction, a source/drain region that is on the insulating layer beside the gate electrode, and an active pattern that penetrates the gate electrode and is electrically connected to the source/drain region, where the insulating layer includes a first part overlapping the field insulating layer in a third direction intersecting the first direction and the second direction and a second part not overlapping the field insulating layer in the third direction, and where a bottom surface of the source/drain region contacts the second part of the insulating layer.

According to another aspect of the present disclosure, there is provided a semiconductor device comprising, a lower insulating layer including a first region and a second region, a first fin-shaped insulating layer on the first region of the lower insulating layer and extending in a first direction, a second fin-shaped insulating layer on the second region of the lower insulating layer and extending in the first direction, a plurality of gate structures that are on the first and second fin-shaped insulating layers and include a gate electrode intersecting the first and second fin-shaped insulating layers, a first source/drain region that is on the first fin-shaped insulating layer, a second source/drain region that is on the second fin-shaped insulating layer, a first active pattern that is on the first fin-shaped insulating layer and penetrates the gate electrode and is electrically connected to the first source/drain region, and a second active pattern that is on the second fin-shaped insulating layer and penetrates the gate electrode and is electrically connected to the second source/drain region, where the gate electrode extends in a second direction intersecting the first direction, and where a bottom surface of the first source/drain region is higher than a bottom surface of the second source/drain region relative to an upper surface of the lower insulating layer.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
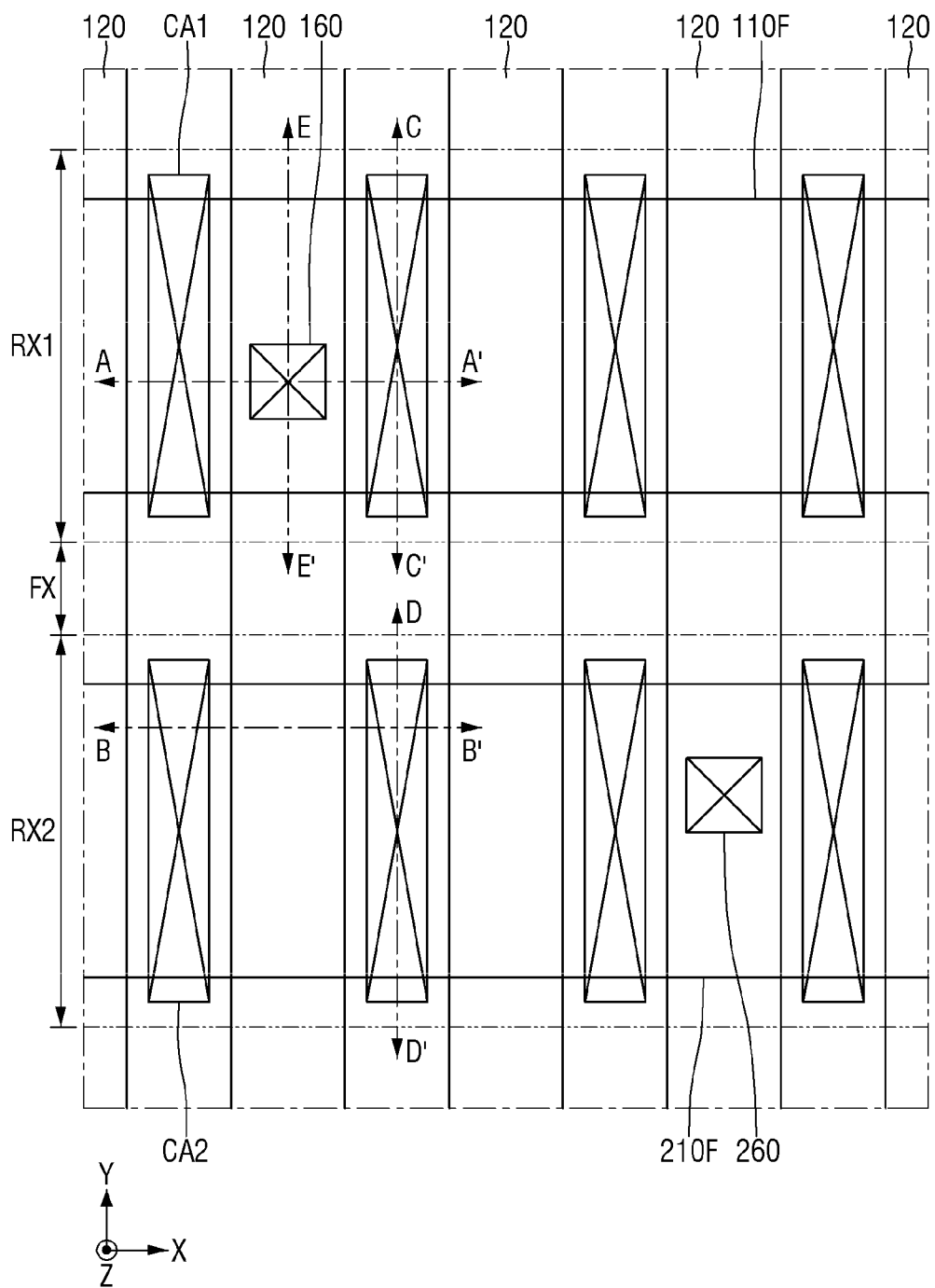
FIG. 1 is an example layout view of a semiconductor device according to embodiments.

In the drawings relating to semiconductor devices according to embodiments, a fin field effect transistor (FinFET) including a fin pattern-shaped channel region, a transistor including a nanowire or nanosheet, and a multi-bridge-channel FET (MBCFET™) are illustrated as examples. However, the present disclosure is not limited thereto. A semiconductor device according to embodiments may include a tunneling FET or a three-dimensional (3D) transistor. A semiconductor device according to embodiments may include a planar transistor. Further, the present disclosure is applicable to two-dimensional (2D) material-based FETs and heterostructures thereof.

In addition, a semiconductor device according to embodiments may include a bipolar junction transistor, a lateral double diffused metal oxide semiconductor transistor (LDMOS), or the like.

Hereinafter, semiconductor devices according to embodiments will be described with reference to FIGS. 1 through 17.

Figure 2:
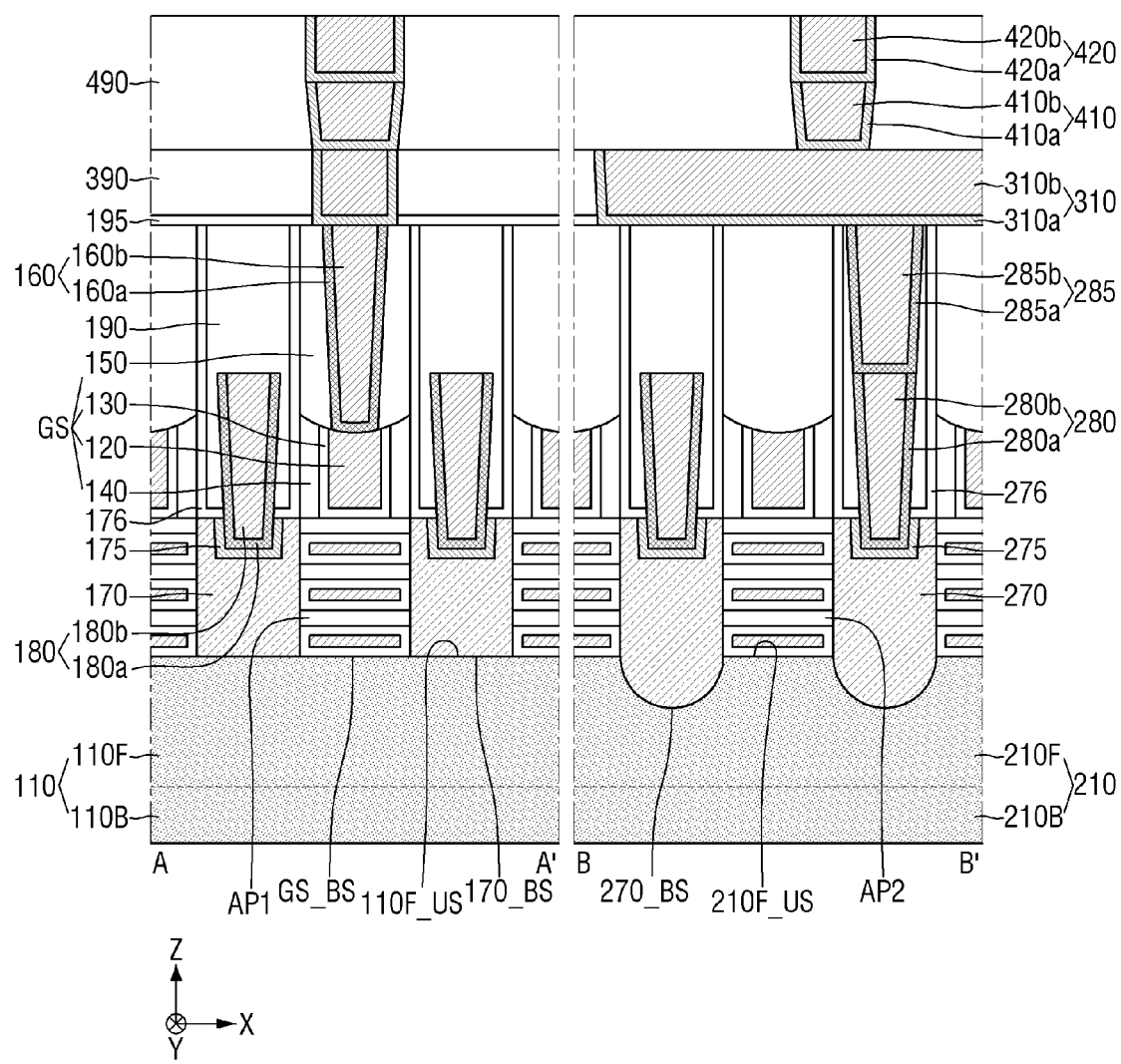
FIG. 2 is an example cross-sectional view taken along lines A-A' and B-B' of FIG. 1.
Figure 3:
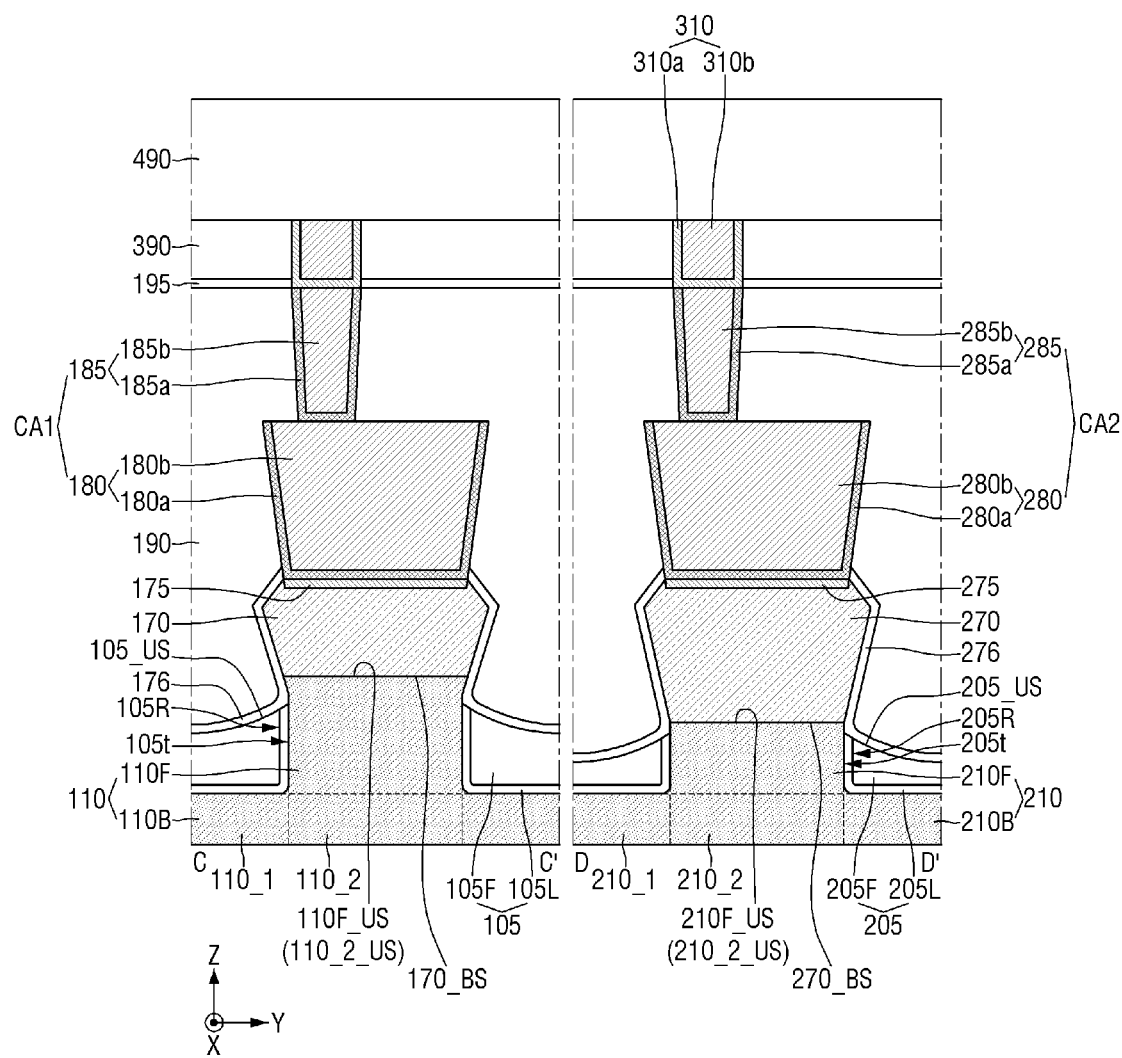
FIG. 3 is an example cross-sectional view taken along lines C-C' and D-D' of FIG. 1.
Figure 4:
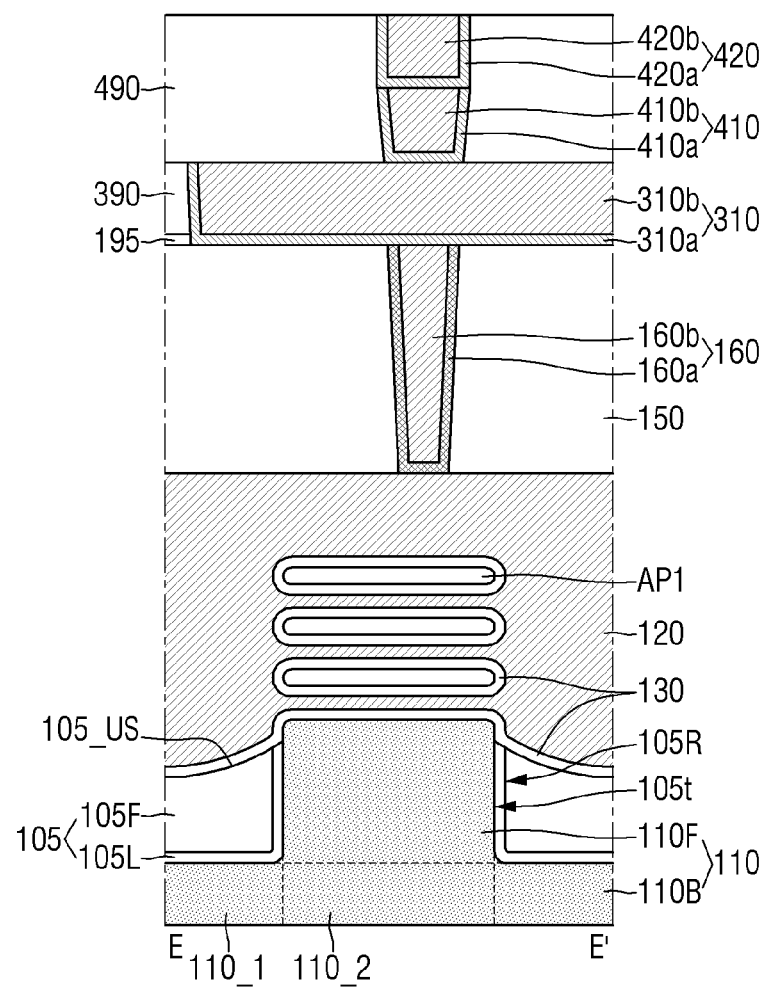
FIG. 4 is an example cross-sectional view taken along line E-E' of FIG. 1.

FIG. 1 is an example layout view of a semiconductor device according to embodiments. FIG. 2 is an example cross-sectional view taken along lines A-A' and B-B' of FIG. 1. FIG. 3 is an example cross-sectional view taken along lines C-C' and D-D' of FIG. 1. FIG. 4 is an example cross-sectional view taken along line E-E' of FIG. 1.

Referring to FIGS. 1 through 4, the semiconductor device according to the embodiments may include a first insulating layer 110, a second insulating layer 210, gate electrodes 120, first active contacts CA1, second active contacts CA2, a first gate contact 160, and a second gate contact 260.

The first insulating layer 110 may be formed in a first region. The second insulating layer 210 may be formed in a second region. In some embodiments, the first region may be a first active region RX1, and the second region may be a second active region RX2. However, the present disclosure is not limited thereto.

The first insulating layer 110 may include a first lower insulating layer 110B and a first fin-shaped insulating layer 110F. The second insulating layer 210 may include a second lower insulating layer 210B and a second fin-shaped insulating layer 210F.

The lower insulating layers 110B and 210B may include the first active region RX1, the second active region RX2, and a field region FX. The field region FX may be formed immediately adjacent to the first active region RX1 and the second active region RX2. The field region RX may form a boundary with the first active region RX1 and the second active region RX2.

The first active region RX1 and the second active region RX2 are spaced apart from each other. The first active region RX1 and the second active region RX2 may be separated by the field region FX.

In other words, an element isolation layer may be disposed around the first active region RX1 and the second active region RX2 spaced apart from each other. Here, a part of the element isolation layer which is disposed between the first active region RX1 and the second active region RX2 may be the field region FX. For example, a part in which a channel region of a transistor, which may be an example of a semiconductor device, is formed may be an active region, and a part which divides the channel region of the transistor formed in the active region may be a field region. Alternatively, the active region may be a part in which a fin pattern or nanosheet used as a channel region of a transistor is formed, and the field region may be a region in which the fin pattern or nanosheet used as the channel region is not formed.

In an embodiment, one of the first active region RX1 and the second active region RX2 may be a p type metal oxide semiconductor (PMOS) region, and the other may be an n type metal oxide semiconductor (NMOS) region. In an embodiment, the first active region RX1 and the second active region RX2 may be PMOS regions. In an embodiment, the first active region RX1 and the second active region RX2 may be NMOS regions. The first active region RX1 will hereinafter be described as an NMOS region, and the second region RX2 as a PMOS region.

The first fin-shaped insulating layer 110F and the second fin-shaped insulating layer 210F may be formed on the lower insulating layers 110B and 210B, respectively. For example, the first fin-shaped insulating layer 110F may be formed on the first lower insulating layer 110B. The second fin-shaped insulating layer 210F may be formed on the second lower insulating layer 210B.

In some embodiments, the first fin-shaped insulating layer 110F may be formed in the first active region RX1. The first fin-shaped insulating layer 110F may protrude from the first lower insulating layer 110B of the first active region RX1 in a third direction Z. The first fin-shaped insulating layer 110F disposed on the first lower insulating layer 110B may extend along a first direction X. For example, the first fin-shaped insulating layer 110F may include long sides extending in the first direction X and short sides extending in a second direction Y. Here, the first direction X may intersect the second direction Y and the third direction Z. In addition, the second direction Y may intersect the third direction Z.

An upper surface 110F_US of the first fin-shaped insulating layer 110F may contact bottom surfaces 170_BS of first source/drain patterns (e.g., source/drain regions) 170. The upper surface 110F_US of the first fin-shaped insulating layer 110F may contact bottom surfaces GS_BS of gate structures GS. For example, as shown in FIG. 2, respective portions of the upper surface 110F_US of the first fin-shaped insulating layer 110F may contact (i) a bottom surface 170_BS of one of the first source/drain patterns 170, (ii) a bottom surface 170_BS of another one of the first source/drain patterns 170, and (iii) a bottom surface GS_BS of a gate structure GS that is between the pair of source/drain patterns 170. In the semiconductor device according to the embodiments of the present disclosure, the first fin-shaped insulating layer 110F contacts the first source/drain patterns 170 to block a leakage current generated between the bottom surfaces 170_BS of the first source/drain patterns 170.

The second fin-shaped insulating layer 210F may be formed in the second active region RX2. The second fin-shaped insulating layer 210F may protrude from the second lower insulating layer 210B of the second active region RX2 in the third direction Z. An upper surface 210F_US of the second fin-shaped insulating layer 210F may contact bottom surfaces 270_BS of second source/drain patterns (e.g., source/drain regions) 270. The upper surface 210F_US of the second fin-shaped insulating layer 210F may contact the bottom surfaces GS_BS of the gate structures GS. Likewise, in the semiconductor device according to the embodiments of the present disclosure, the second fin-shaped insulating layer 210F contacts the second source/drain patterns 270 to block a leakage current generated between the bottom surfaces 270_BS of the second source/drain patterns 270.

The description of the second fin-shaped insulating layer 210F may be substantially the same as the description of the first fin-shaped insulating layer 110F.

In FIG. 2, the first fin-shaped insulating layer 110F may not overlap the first source/drain patterns 170 in the first direction X. The bottom surfaces 170_BS of the first source/drain patterns 170 may lie in the same plane as (i.e., may be coplanar with) the bottom surfaces GS_BS of the gate structures GS.

At least a part of the second fin-shaped insulating layer 210F may overlap the second source/drain patterns 270 in the first direction X. The bottom surfaces 270_BS of the second source/drain patterns 270 may be lower than the bottom surfaces GS_BS of the gate structures GS relative to an upper surface of the second lower insulating layer 210B. The bottom surfaces 270_BS of the second source/drain patterns 270 may be lower than the bottom surfaces 170_BS of the first source/drain patterns 170 relative to the upper surface of the second lower insulating layer 210B. That is, a height/thickness of the first source/drain patterns 170 in the third direction Z may be smaller than a height/thickness of the second source/drain patterns 270 in the third direction Z.

In FIG. 3, the first insulating layer 110 may include a first part 110_1 overlapping a first field insulating layer 105 in the third direction Z and a second part 110_2 not overlapping the first field insulating layer 105 in the third direction Z. The second part 110_2 of the first insulating layer 110 may be disposed between adjacent first parts 110_1 of the first insulating layer 110. A height of the second part 110_2 of the first insulating layer 110 in the third direction Z may be greater than a height of the first part 110_1 of the first insulating layer 110 in the third direction Z. The first fin-shaped insulating layer 110F may be a part of the second part 110_2 of the first insulating layer 110.

The second insulating layer 210 may include a first part 210_1 overlapping a second field insulating layer 205 in the third direction Z and a second part 210_2 not overlapping the second field insulating layer 205 in the third direction Z. The second part 210_2 of the second insulating layer 210 may be disposed between adjacent first parts 210_1 of the second insulating layer 210. A height of the second part 210_2 of the second insulating layer 210 in the third direction Z may be greater than a height of the first part 210_1 of the second insulating layer 210 in the third direction Z. The second fin-shaped insulating layer 210F may be a part of the second part 210_2 of the second insulating layer 210.

The second part 110_2 of the first insulating layer 110 may contact a first source/drain pattern 170. An upper surface 110_2 US of the second part 110_2 of the first insulating layer 110 may contact the bottom surface 170_BS of the first source/drain pattern 170. The second part 210_2 of the second insulating layer 210 may contact a second source/drain pattern 270. An upper surface 210_2 US of the second part 210_2 of the second insulating layer 210 may contact the bottom surface 270_BS of the second source/drain pattern 270.

In some embodiments, a height of the second part 110_2 of the first insulating layer 110 in the third direction Z may be greater than a height of the second part 210_2 of the second insulating layer 210 in the third direction Z. The height of the first source/drain pattern 170 in the third direction Z may be smaller than the height of the second source/drain pattern 270 in the third direction Z.

In FIG. 4, the second part 110_2 of the first insulating layer 110 may be overlapped by first active patterns AP1 in the third direction Z. The first insulating layer 110 may be spaced apart from the first active patterns AP1 in the third direction Z. The first insulating layer 110 may not contact the first active patterns AP1. A gate insulating layer 130 may be disposed on the second part 110_2 of the first insulating layer 110. The gate insulating layer 130 may cover the first active patterns AP1.

Likewise, the first fin-shaped insulating layer 110F may be overlapped by the first active patterns AP1 in the third direction Z. The first fin-shaped insulating layer 110F may be spaced apart from the first active patterns AP1 in the third direction Z. The first fin-shaped insulating layer 110F may not contact the first active patterns AP1.

The first fin-shaped insulating layer 110F may completely cover the bottom surfaces 170_BS of the first source/drain patterns 170. Accordingly, a leakage current between the first source/drain patterns 170 may be blocked. The second fin-shaped insulating layer 210F may completely cover the bottom surfaces 270_BS of the second source/drain patterns 270. Accordingly, a leakage current between the second source/drain patterns 270 may be blocked.

The first and second insulating layers 110 and 210 may include an oxide-based insulating material. The first and second insulating layers 110 and 210 may include at least one of, for example, silicon oxide, silicon oxynitride, and a low-k material. The low-k material may include, but is not limited to, for example, fluorinated tetraethylorthosilicate (FTEOS), hydrogen silsesquioxane (HSQ), bis-benzocyclobutene (BCB), tetramethylorthosilicate (THOS), octamethylcyclotetrasiloxane (OMCTS), hexamethyldisiloxane (HAMS), trimethylsilyl borate (TMSB), diacetoxyditertiarybutosiloxane (DADBS), trimethylsilil phosphate (TMSP), polytetrafluoroethylene (PTFE), tonen silazen (TOSZ), fluoride silicate glass (FSG), polyimide nanofoams such as polypropylene oxide, carbon doped silicon oxide (CDO), organo silicate glass (CSG), SiLK, amorphous fluorinated carbon, silica aerogels, silica xerogels, mesoporous or a combination of the same.

In FIGS. 3 and 4, a first trench 105t extending in the first direction X may be disposed in the first insulating layer 110.

The first trench 105t may be disposed on the first lower insulating layer 110B. The first trench 105t may be disposed beside (e.g., on a sidewall of) the first fin-shaped insulating layer 110F (and/or between a plurality of the first fin-shaped insulating layers 110F). The first trench 105t may be disposed on opposite side surfaces of the first fin-shaped insulating layer 110F. A bottom surface of the first trench 105t may lie in the same plane as an upper surface of the first lower insulating layer 110B. The first trench 105t may overlap the first part 110_1 of the first insulating layer 110 in the third direction Z. The first trench 105t may not overlap the second part 110_2 of the first insulating layer 110 in the third direction Z. The first trench 105t may not overlap the first part 110_1 in the second direction Y. The first trench 105t may overlap at least a part of the second part 110_2 of the first insulating layer 110 in the second direction Y.

A second trench 205t extending in the first direction X may be disposed in the second insulating layer 210. The second trench 205t may be disposed on the second lower insulating layer 210B. The second trench 205t may be disposed beside the second fin-shaped insulating layer 210F (and/or between a plurality of the second fin-shaped insulating layers 210F). The second trench 205t may be disposed on opposite side surfaces of the second fin-shaped insulating layer 210F. A bottom surface of the second trench 205t may lie in the same plane as the upper surface of the second lower insulating layer 210B. The second trench 205t may overlap the first part 210_1 of the second insulating layer 210 in the third direction Z. The second trench 205t may not overlap the second part 210_2 of the second insulating layer 210 in the third direction Z. The second trench 205t may not overlap the first part 210_1 in the second direction Y. The second trench 205t may overlap at least a part of the second part 210_2 of the second insulating layer 210 in the second direction Y.

The first field insulating layer 105 may be in (e.g., may fill) the first trench 105t. The first field insulating layer 105 may be disposed in the first trench 105t. The second field insulating layer 205 may be in (e.g., may fill) the second trench 205t. The second field insulating layer 205 may be disposed in the second trench 205t.

In some embodiments, the first field insulating layer 105 may include a first field liner layer 105L and a first field filling layer 105F.

The first field liner layer 105L may be disposed along sidewalls and the bottom surface of the first trench 105t. The first field filling layer 105F may be formed on the first field liner layer 105L. The first field filling layer 105F may fill the remaining space of the first trench 105t filled with the first field liner layer 105L.

In some embodiments, the first field liner layer 105L may define a first field recess 105R. The first field filling layer 105F may fill the first field recess 105R.

The first field liner layer 105L may include a horizontal part disposed along the bottom surface of the first trench 105t and a vertical part disposed along the sidewalls of the first trench 105t. The horizontal part of the first field liner layer 105L may define a bottom surface of the first field recess 105R. The vertical part of the first field liner layer 105L may define sidewalls of the first field recess 105R.

The horizontal part of the first field liner layer 105L may contact the first lower insulating layer 110B. The vertical part of the first field liner layer 105L may contact the first fin-shaped insulating layer 110F. The horizontal part of the first field liner layer 105L may contact the upper surface of the first lower insulating layer 110B. The vertical part of the first field liner layer 105L may contact sidewalls of the first fin-shaped insulating layer 110F.

The horizontal part of the first field liner layer 105L may contact the first part 110_1 of the first insulating layer 110. The horizontal part of the first field liner layer 105L may contact an upper surface of the first part 110_1 of the first insulating layer 110. The vertical part of the first field liner layer 105L may contact the second part 110_2 of the first insulating layer 110. The vertical part of the first field liner layer 105L may contact sidewalls of the second part 110_2 of the first insulating layer 110.

An upper surface 105_US of the first field insulating layer 105 may be convex toward the first lower insulating layer 1101B. That is, the upper surface 105_US of the first field insulating layer 105 may gradually become lower toward the upper surface of the first lower insulating layer 110B as the distance from the sidewalls of the first fin-shaped insulating layer 110F increases. However, the present disclosure is not limited thereto.

In some embodiments, the second field insulating layer 205 may include a second field liner layer 205L and a second field filling layer 205F. The second field liner layer 205L may be disposed along the bottom surface and sidewalls of the second trench 205t. The second field filling layer 205F may be formed on the second field liner layer 205L to fill the remaining space of the second trench 205t filled with the second field liner layer 205L. The second field liner layer 205L may define a second field recess 205R. The second field filling layer 205F may fill the second field recess 205R.

The description of the second field insulating layer 205 may be substantially the same as the description of the first field insulating layer 105.

In FIG. 3, the upper surface 105_US of the first field insulating layer 105 may be formed to be higher than an upper surface 205_US of the second field insulating layer 205. That is, the upper surface 105_US of the first field insulating layer 105 may be higher than the upper surface 205_US of the second field insulating layer 205 relative to the upper surfaces of the lower insulating layers 110B and 210B.

In FIGS. 3 and 4, the upper surface 105_US of the first field insulating layer 105 may be formed to be lower than the upper surface 110F_US of the first fin-shaped insulating layer 1101F. That is, the upper surface 105_US of the first field insulating layer 105 may be lower than the upper surface 110F_US of the first fin-shaped insulating layer 110F relative to the upper surface of the first lower insulating layer 110B.

In some embodiments, the upper surface 105_US of the first field insulating layer 105 may contact the sidewalls of the first fin-shaped insulating layer 110F. The upper surface 205_US of the second field insulating layer 205 may contact sidewalls of the second fin-shaped insulating layer 210F. However, the present disclosure is not limited thereto.

Each of the first field liner layer 105L and the second field liner 205L may include, for example, silicon nitride. Each of the first field filling layer 105F and the second field filling layer 205F may include, for example, silicon oxide. However, the present disclosure is not limited thereto.

One or more first active patterns AP1 may be formed in the first active region RX1. The first active patterns AP1 may be disposed on the first fin-shaped insulating layer 110F. The first active patterns AP1 may be disposed on the first fin-shaped insulating layer 110F to penetrate a gate electrode 120. The first active patterns AP1 may be spaced apart from the first fin-shaped insulating layer 110F in the third direction Z. The first active patterns AP1 may not contact the first fin-shaped insulating layer 110F. The first active patterns AP1 may be spaced apart from each other in the third direction Z.

One or more second active patterns AP2 may be formed in the second active region RX2. The description of the second active patterns AP2 may be substantially the same as the description of the first active patterns AP1.

Each of the first and second active patterns AP1 and AP2 may be a multi-channel active pattern. In the semiconductor device according to the embodiments, each of the first and second active patterns AP1 and AP2 may be, for example, a sheet pattern.

Although three first active patterns AP1 and three second active patterns AP2 are illustrated in the drawings, this is merely an example used for ease of description, and the present disclosure is not limited to this example.

The first active patterns AP1 may penetrate each gate electrode 120 and may be connected (e.g., electrically connected) to the first source/drain patterns 170. The second active patterns AP2 may penetrate each gate electrode 120 and may be connected (e.g., electrically connected) to the second source/drain patterns 270.

The first active patterns AP1 and the second active patterns AP2 may include an elemental semiconductor material such as silicon or germanium. Alternatively, the first active patterns AP1 and the second active patterns AP2 may include a compound semiconductor such as a group IV-IV compound semiconductor or a group III-V compound semiconductor.

The group IV-IV compound semiconductor may be, e.g., a binary or ternary compound including two or more of carbon (C), silicon (Si), germanium (Ge) and tin (Sn) or a compound obtained by doping the binary or ternary compound with a group IV element.

The group III-V compound semiconductor may be, e.g., a binary, ternary, or quaternary compound formed of at least one of aluminum (Al), gallium (Ga) and indium (In) (i.e., group III elements) bonded with one of phosphorus (P), arsenic (As) and antimony (Sb) (i.e., group V elements).

In some embodiments, the first active patterns AP1 and the second active patterns AP2 may include the same material. In an embodiment, the first active patterns AP1 and the second active patterns AP2 may include different materials.

A plurality of gate structures GS may be disposed on the first and second insulating layers 110 and 210. The gate structures GS may be disposed on the first and second lower insulating layers 110B and 210B. The gate structures GS may be disposed on the first fin-shaped insulating layer 110F and the second fin-shaped insulating layer 210F. One or more gate structures GS may extend in the second direction Y. The gate structures GS may be disposed on the first and second field insulating layers 105 and 205. The gate structures GS may be spaced apart from each other in the first direction X.

The gate structures GS may intersect the first fin-shaped insulating layer 110F and the second fin-shaped insulating layer 210F.

Although the gate structures GS are disposed across the first active region RX1 and the second active region RX2 in the drawings, this is merely an example used for ease of description, and the present disclosure is not limited to this example. That is, a part of each of the gate structures GS may be divided into two parts by a gate separation structure disposed on the first and second field insulating layers 105 and 205 and may be disposed accordingly on the first active region RX1 and the second active region RX2.

Each of the gate structures GS may include, for example, a gate electrode 120, a gate insulating layer 130, gate spacers 140, and a gate capping pattern 150.

The gate electrode 120 may be formed on the first fin-shaped insulating layer 110F and the second fin-shaped insulating layer 210F. The gate electrode 120 may intersect the first fin-shaped insulating layer 110F and the second fin-shaped insulating layer 210F. The gate electrode 120 may include long sides extending in the second direction Y and short sides extending in the first direction X.

An upper surface of the gate electrode 120 may be a concave surface recessed toward upper surfaces of the first and second insulating layers 110 and 210. However, the present disclosure is not limited thereto. That is, unlike in the drawings, the upper surface of the gate electrode 120 may also be a flat surface.

The gate electrode 120 may include at least one of, for example, titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), and combinations of the same.

The gate electrode 120 may include a conductive metal oxide, a conductive metal oxynitride, or an oxidized form of the above materials.

The gate spacers 140 may be disposed on sidewalls of the gate electrode 120. The gate spacers 140 may extend in the second direction Y.

The gate spacers 140 may include at least one of, for example, silicon nitride (SiN), silicon oxynitride (SiON), silicon oxide ($SiO_2$), silicon oxycarbonitride (SiOCN), silicon boron nitride (SiBN), silicon oxyboron nitride (SiOBN), silicon oxycarbide (SiOC), and combinations of the same.

The gate insulating layer 130 may extend along the sidewalls and bottom surface of the gate electrode 120. The gate insulating layer 130 may be formed between the gate electrode 120 and the gate spacers 140.

The gate insulating layer 130 may include silicon oxide, silicon oxynitride, silicon nitride, or a high-k material having a higher dielectric constant than silicon oxide. The high-k material may include one or more of, for example, boron nitride, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

The semiconductor device according to the embodiments may include a negative capacitance FET using a negative capacitor. For example, the gate insulating layer 130 may include a ferroelectric material layer having ferroelectric properties and a paraelectric material layer having paraelectric properties.

The ferroelectric material layer may have a negative capacitance, and the paraelectric material layer may have a positive capacitance. For example, when two or more capacitors are connected in series and the capacitance of each of the capacitors has a positive value, the total capacitance is reduced compared with the capacitance of each individual capacitor. On the other hand, when at least one of the capacitances of two or more capacitors connected in series has a negative value, the total capacitance may have a positive value and may be greater than an absolute value of each individual capacitance.

When the ferroelectric material layer having a negative capacitance and the paraelectric material layer having a positive capacitance are connected in series, the total capacitance value of the ferroelectric material layer and the paraelectric material layer connected in series may increase. By using the increase in the total capacitance value, a transistor including the ferroelectric material layer may have a sub-threshold swing (SS) of less than 60 m/Vdecade at room temperature.

The ferroelectric material layer may have ferroelectric properties. The ferroelectric material layer may include at least one of, e.g., hafnium oxide, hafnium zirconium oxide, barium strontium titanium oxide, barium titanium oxide, and lead zirconium titanium oxide. Here, for example, hafnium zirconium oxide may be a material obtained by doping hafnium oxide with zirconium (Zr). For another example, hafnium zirconium oxide may be a compound of hafnium (Hf), zirconium (Zr) and oxygen (O).

The ferroelectric material layer may further include a dopant. For example, the dopant may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and tin (Sn). The type of dopant included in the ferroelectric material layer may vary according to which ferroelectric material is included in the ferroelectric material layer.

When the ferroelectric material layer includes hafnium oxide, the dopant included in the ferroelectric material layer may include at least one of, e.g., gadolinium (Gd), silicon (Si), zirconium (Zr), aluminum (Al), and yttrium (Y).

When the dopant is aluminum (Al), the ferroelectric material layer may include 3 to 8 atomic % (at %) of aluminum. Here, the ratio of the dopant may be the ratio of aluminum to the sum of hafnium and aluminum.

When the dopant is silicon (Si), the ferroelectric material layer may include 2 to 10 at % of silicon. When the dopant is yttrium (Y), the ferroelectric material layer may include 2 to 10 at % of yttrium. When the dopant is gadolinium (Gd), the ferroelectric material layer may include 1 to 7 at % of gadolinium. When the dopant is zirconium (Zr), the ferroelectric material layer may include 50 to 80 at % of zirconium.

The paraelectric material layer may have paraelectric properties. The paraelectric material layer may include at least one of, e.g., silicon oxide and a metal oxide having a high dielectric constant. The metal oxide included in the paraelectric material layer may include, but is not limited to, at least one of, e.g., hafnium oxide, zirconium oxide, and aluminum oxide.

The ferroelectric material layer and the paraelectric material layer may include the same material. While the ferroelectric material layer has ferroelectric properties, the paraelectric material layer may not have ferroelectric properties. For example, when the ferroelectric material layer and the paraelectric material layer include hafnium oxide, the crystal structure of hafnium oxide included in the ferroelectric material layer is different from the crystal structure of hafnium oxide included in the paraelectric material layer.

The ferroelectric material layer may have a thickness having ferroelectric properties. The thickness of the ferroelectric material layer may be, but is not limited to, 0.5 to 10 nanometers (nm). Each ferroelectric material may have a different critical thickness showing ferroelectric properties. Therefore, the thickness of the ferroelectric material layer may vary according to the ferroelectric material.

In some embodiments, the gate insulating layer 130 may include one ferroelectric material layer. In an embodiment, the gate insulating layer 130 may include a plurality of ferroelectric material layers spaced apart from each other. The gate insulating layer 130 may have a structure in which a plurality of ferroelectric material layers and a plurality of paraelectric material layers are alternately stacked.

The gate capping pattern 150 may be disposed on the upper surface of the gate electrode 120 and upper surfaces of the gate spacers 140. The gate capping layer 150 may include at least one of, for example, silicon nitride (SiN), silicon oxynitride (SiON), silicon oxide ($SiO_2$), silicon carbonitride (SiCN), silicon oxycarbonitride (SiOCN), and combinations of the same.

Unlike in the drawings, the gate capping pattern 150 may also be disposed between the gate spacers 140. In this case, an upper surface of the gate capping pattern 150 may lie in the same plane as the upper surfaces of the gate spacers 140. The upper surface of the gate capping pattern 150 may be an upper surface of each of the gate structures GS.

The first source/drain patterns 170 may be formed on the first fin-shaped insulating layer 110F. Each of the first source/drain patterns 170 may be disposed between the gate structures GS. The first source/drain patterns 170 may be disposed on side surfaces of each of the gate structures GS. Each of the first source/drain patterns 170 may be disposed between adjacent gate structures GS.

In some embodiments, the first source/drain patterns 170 may be disposed on opposite sides of each of the gate structures GS. Unlike in the drawings, a first source/drain pattern 170 may be disposed on a side of each of the gate structures GS and may not be disposed on the other side of the gate structure GS.

The second source/drain patterns 270 may be formed on the second fin-shaped insulating layer 210F. Each of the second source/drain patterns 270 may be disposed between the gate structures GS. The second source/drain patterns 270 may be disposed on the side surfaces of each of the gate structures GS. Each of the second source/drain patterns 270 may be disposed between adjacent gate structures GS.

In some embodiments, the second source/drain patterns 270 may be disposed on opposite sides of each of the gate structures GS. Unlike in the drawings, a second source/drain pattern 270 may be disposed on one side of each of the gate structures GS and may not be disposed on an opposite side of the gate structure GS.

The bottom surfaces 170_BS of the first source/drain patterns 170 may lie in the same plane as the bottom surfaces GS_BS of the gate structures GS. The bottom surfaces 270_BS of the second source/drain patterns 270 may protrude from the bottom surfaces GS_BS of the gate structures GS toward the second lower insulating layer 210B. That is, the bottom surfaces 270_BS of the second source/drain patterns 270 may be curved surfaces convex toward the second lower insulating layer 210B. However, the present disclosure is not limited thereto.

The bottom surfaces 170_BS of the first source/drain patterns 170 are higher than the bottom surfaces 270_BS of the second source/drain patterns 270 relative to the upper surfaces of the lower insulating layers 110B and 210B. The height of the first source/drain patterns 170 in the third direction Z is greater than the height of the second source/drain patterns 270 in the third direction Z. However, the present disclosure is not limited thereto.

The first source/drain patterns 170 and the second source/drain patterns 270 may include epitaxial patterns. That is, each of the first source/drain patterns 170 may be included in a source/drain region of a transistor that uses the first active patterns AP1 as a channel region. Each of the second source/drain patterns 270 may be included in a source/drain region of a transistor that uses the second active patterns AP2 as a channel region.

In some embodiments, the first source/drain patterns 170 and the second source/drain patterns 270 may include different materials. For example, the first source/drain patterns 170 may include silicon (Si), and the second source/drain patterns 270 may include silicon germanium (SiGe). However, the present disclosure is not limited thereto.

In some embodiments, a first protective layer 176 may be disposed on the upper surface 105_US of the first field insulating layer 105, sidewalls of the gate structures GS, and sidewalls of the first source/drain patterns 170. The first protective layer 176 may extend to the upper surface of the gate capping pattern 150. A second protective layer 276 may be disposed on the upper surface 205_US of the second field insulating layer 205, the sidewalls of the gate structures GS, and sidewalls of the second source/drain patterns 270. In an embodiment, although not illustrated, the first protective layer 176 and the second protective layer 276 may not be formed.

The first protective layer 176 and the second protective layer 276 may include, for example, a material having an etch selectivity with respect to a first interlayer insulating layer 190. The first protective layer 176 and the second protective layer 276 may include at least one of, for example, silicon nitride (SiN), silicon oxynitride (SiON), silicon oxycarbonitride (SiOCN), silicon boron nitride (SiBN), silicon oxyboron nitride (SiOBN), silicon oxycarbide (SiOC), and combinations of the same.

The first active contacts CA1 may be disposed on the first active region RX1. The second active contacts CA2 may be disposed on the second active region RX2.

The first active contacts CA1 may be connected to the first source/drain patterns 170 formed in the first active region RX1. The second active contacts CA2 may be connected to the second source/drain patterns 270 formed in the second active region RX2.

In some embodiments, each of the first active contacts CA1 may include a first lower active contact 180 and a first upper active contact 185.

The first lower active contact 180 may be formed on a first source/drain pattern 170. The first lower active contact 180 may be connected to the first source/drain pattern 170. Although an upper surface of the first lower active contact 180 is higher than the upper surface of the gate electrode 120 in the drawings, this is merely an example used for ease of description, and the present disclosure is not limited to this example. The upper surface of the first lower active contact 180 may also be formed to be lower than the upper surface of the gate electrode 120.

A first silicide layer 175 may be formed between the first lower active contact 180 and the first source/drain pattern 170. Although the first silicide layer 175 is formed along the profile of a boundary surface between the first source/drain pattern 170 and the first lower active contact 180 in the drawings, the present disclosure is not limited thereto. The first silicide layer 175 may include, for example, a metal silicide material.

The first lower active contact 180 may be formed as a multilayer. The first lower active contact 180 may include, for example, a first lower active contact barrier layer 180a and a first lower active contact filling layer 180b. The first lower active contact filling layer 180b may be disposed on the first lower active contact barrier layer 180a. The first lower active contact barrier layer 180a may extend along sidewalls and a bottom surface of the first lower active contact filling layer 180b.

The first lower active contact barrier layer 180a may include at least one of, for example, tantalum (Ta), tantalum nitride (TaN), titanium (Ti), titanium nitride (TiN), titanium silicon nitride (TiSiN), ruthenium (Ru), cobalt (Co), nickel (Ni), nickel boron (NiB), tungsten (W), tungsten nitride (WN), tungsten carbonitride (WCN), zirconium (Zr), zirconium nitride (ZrN), vanadium (V), vanadium nitride (VN), niobium (Nb), niobium nitride (NbN), platinum (Pt), iridium (Ir), rhodium (Rh), and a 2D material. In the semiconductor device according to the embodiments, the 2D material may be a metallic material and/or a semiconductor material. The 2D material may include a 2D allotrope or a 2D compound, for example, may include, but is not limited to, at least one of graphene, molybdenum disulfide ($MoS_2$), molybdenum diselenide ($MoSe_2$), tungsten diselenide ($WSe_2$), and tungsten disulfide ($WS_2$). That is, the above 2D materials are merely listed as examples, and a 2D material that can be included in the semiconductor device of the present disclosure is not limited to the above materials.

The first lower active contact filling layer 160b may include at least one of, for example, aluminum (Al), tungsten (W), cobalt (Co), ruthenium (Ru), silver (Ag), gold (Au), manganese (Mn), and molybdenum (Mo).

The first upper active contact 185 may be disposed on the first lower active contact 180. The first upper active contact 185 may be connected to the first lower active contact 180. That is, the first upper active contact 185 may be connected to the first source/drain pattern 170 through the first lower active contact 180.

The first upper active contact 185 may be formed as a multilayer. The first upper active contact 185 may include, for example, a first upper active contact barrier layer 185a and a first upper active contact filling layer 185b. The first upper active contact filling layer 185b may be disposed on the first upper active contact barrier layer 185a. The first upper active contact barrier layer 185a may be disposed along sidewalls and a bottom surface of the first upper active contact filling layer 185b.

The description of materials included in the first upper active contact barrier layer 185a and the first upper active contact filling layer 185b may be the same as the description of the materials included in the first lower active contact barrier layer 180a and the first lower active contact filling layer 180b.

Each of the second active contacts CA2 may include a second lower active contact 280 and a second upper active contact 285. The description of the second lower active contact 280 may be the same as the description of the first lower active contact 180. The description of the second upper active contact 285 may be the same as the description of the first upper active contact 185.

A second silicide layer 275 may be formed between the second lower active contact 280 and a second source/drain pattern 270. Although the second silicide layer 275 is formed along the profile of a boundary surface between the second source/drain pattern 270 and the second lower active contact 280 in the drawings, the present disclosure is not limited thereto. The second silicide layer 275 may include, for example, a metal silicide material.

The second lower active contact 280 may be formed as a multilayer. The second lower active contact 280 may include, for example, a second lower active contact barrier layer 280a and a second lower active contact filling layer 280b. The second lower active contact filling layer 280b may be disposed on the second lower active contact barrier layer 280a. The second lower active contact barrier layer 280a may be disposed along sidewalls and a bottom surface of the second lower active contact filling layer 280b.

The description of materials included in the second lower active contact barrier layer 280a and the second lower active contact filling layer 280b may be the same as the description of the materials included in the first lower active contact barrier layer 180a and the first lower active contact filling layer 180b.

The second upper active contact 285 may be disposed on the second lower active contact 280. The second upper active contact 285 may be connected to the second lower active contact 280. That is, the second upper active contact 285 may be connected to the second source/drain pattern 270 through the second lower active contact 280.

The second upper active contact 285 may be formed as a multilayer. The second upper active contact 285 may include, for example, a second upper active contact barrier layer 285a and a second upper active contact filling layer 285b. The second upper active contact filling layer 285b may be disposed on the second upper active contact barrier layer 285a. The second upper active contact barrier layer 285a may be disposed along sidewalls and a bottom surface of the second upper active contact filling layer 285b.

The description of materials included in the second upper active contact barrier layer 285a and the second upper active contact filling layer 285b may be the same as the description of the materials included in the first lower active contact barrier layer 180a and the first lower active contact filling layer 180b.

The first gate contact 160 may be disposed on the first active region RX1. The second gate contact 260 may be disposed on the second active region RX2. The first gate contact 160 and the second gate contact 260 may be substantially the same. Thus, only the first gate contact 160 will be described below.

The first gate contact 160 may be disposed in a gate structure GS. The first gate contact 160 may be connected to the gate electrode 120 included in the gate structure GS. The first gate contact 160 may penetrate the gate capping pattern 150 in the third direction Z.

The first gate contact 160 may be disposed at a position overlapping the gate structure GS. In some embodiments, at least a part of the first gate contact 160 may be disposed at a position overlapping the first active patterns AP1.

An upper surface of the first gate contact 160 may lie in the same plane as the upper surface of the gate capping pattern 150. The upper surface of the first gate contact 160 may lie in the same plane as an upper surface of the second upper active contact 285.

The first gate contact 160 may be formed as a multilayer. The first gate contact 160 may include, for example, a gate contact barrier layer 160a and a gate contact filling layer 160b. The gate contact filling layer 160b may be disposed on the gate contact barrier layer 160a. The gate contact barrier layer 160a may be disposed along sidewalls and a bottom surface of the gate contact filling layer 160b.

The description of materials included in the gate contact barrier layer 160a and the gate contact filling layer 160b may be the same as the description of the materials included in the first lower active contact barrier layer 180a and the first lower active contact filling layer 180b.

The first interlayer insulating layer 190 may be formed on the first source/drain patterns 170, the second source/drain patterns 270, the first field insulating layer 105, and the second field insulating layer 205. The first interlayer insulating layer 190 may cover sidewalls of the first lower active contact 180, sidewalls of the first upper active contact 185, sidewalls of the second lower active contact 280, and sidewalls of the second upper active contact 285.

The first interlayer insulating layer 190 may include at least one of, for example, silicon oxide, silicon nitride, silicon oxynitride, and a low-k material. The low-k material may include, but is not limited to, for example, fluorinated tetraethylorthosilicate (FTEOS), hydrogen silsesquioxane (HSQ), bis-benzocyclobutene (BCB), tetramethylorthosilicate (TMOS), octamethylcyclotetrasiloxane (OMCTS), hexamethyldisiloxane (HMDS), trimethylsilyl borate (TMSB), diacetoxyditertiarybutosiloxane (DADBS), trimethylsilil phosphate (TMSP), polytetrafluoroethylene (PTFE), tonen silazen (TOSZ), fluoride silicate glass (FSG), polyimide nanofoams such as polypropylene oxide, carbon doped silicon oxide (CDO), organo silicate glass (OSG), SiLK, amorphous fluorinated carbon, silica aerogels, silica xerogels, mesoporous silica, or a combination of the same.

In some embodiments, a second interlayer insulating layer 390 and a third interlayer insulating layer 490 may be formed on the first interlayer insulating layer 190.

Each of the second interlayer insulating layer 390 and the third interlayer insulating layer 490 may include at least one of, for example, silicon oxide, silicon nitride, silicon oxynitride, and a low-k material.

In some embodiments, a wiring etch stop layer 195 may extend along the upper surface of the gate capping pattern 150 and an upper surface of the first interlayer insulating layer 190. The second interlayer insulating layer 390 may be disposed on the wiring etch stop layer 195. The wiring etch stop layer 195 may include a material having an etch selectivity with respect to the second interlayer insulating layer 390. The wiring etch stop layer 195 may include at least one of, for example, silicon nitride (SiN), silicon oxynitride (SiON), silicon oxycarbonitride (SiOCN), silicon boron nitride (SiBN), silicon oxyboron nitride (SiOBN), silicon oxycarbide (SiOC), aluminum oxide (AlO), aluminum nitride (AlN), aluminum oxycarbide (AlOC), and combinations of the same.

A first wiring pattern 310 may be disposed on the first gate contact 160 and the second upper active contact 285. The first wiring pattern 310 may be connected to the first gate contact 160. The first wiring pattern 310 may be connected to the second upper active contact 285. The first wiring pattern 310 may penetrate the wiring etch stop layer 195.

The first wiring pattern 310 may be disposed in the second interlayer insulating layer 390. The first wiring pattern 310 may include a part directly contacting the gate capping pattern 150.

The first wiring pattern 310 may have a multi-conductive layer structure. The first wiring pattern 310 may include, for example, a first wiring barrier layer 310a and a first wiring filling layer 310b. The first wiring filling layer 310b may be disposed on the first wiring barrier layer 310a. The first wiring barrier layer 310a may be disposed along sidewalls and a bottom surface of the first wiring filling layer 310b.

The first wiring barrier layer 310a may include at least one of, for example, tantalum (Ta), tantalum nitride (TaN), titanium (Ti), titanium nitride (TiN), titanium silicon nitride (TiSiN), nickel (Ni), nickel boron (NiB), tungsten nitride (WN), tungsten carbonitride (WCN), zirconium (Zr), zirconium nitride (ZrN), vanadium (V), vanadium nitride (VN), niobium (Nb), niobium nitride (NbN), platinum (Pt), iridium (Ir), rhodium (Rh), and a 2D material.

The first wiring filling layer 310b may include at least one of, for example, aluminum (Al), copper (Cu), tungsten (W), cobalt (Co), ruthenium (Ru), silver (Ag), gold (Au), manganese (Mn), and molybdenum (Mo).

In some embodiments, a via structure 410 and a second wiring pattern 420 may be included on the first wiring pattern 310. The via structure 410 and the second wiring pattern 420 may be disposed in the third interlayer insulating layer 490.

The via structure 410 may be formed on the first wiring pattern 310. The via structure 410 may be connected to the first wiring pattern 310. The via structure 410 may be a multilayer including a via barrier layer 410a and a via filling layer 410b. The via filling layer 410b may be disposed on the via barrier layer 410a. The via barrier layer 410a may be disposed along sidewalls and a bottom surface of the via filling layer 410b.

The via barrier layer 410a may include at least one of, for example, tantalum (Ta), tantalum nitride (TaN), titanium (Ti), titanium nitride (TiN), titanium silicon nitride (TiSiN), ruthenium (Ru), cobalt (Co), nickel (Ni), nickel boron (NiB), tungsten (W), tungsten nitride (WN), tungsten carbonitride (WCN), zirconium (Zr), zirconium nitride (ZrN), vanadium (V), vanadium nitride (VN), niobium (Nb), niobium nitride (NbN), platinum (Pt), iridium (Ir), rhodium (Rh), and a 2D material.

The via filling layer 410b may include at least one of, for example, aluminum (Al), copper (Cu), tungsten (W), cobalt (Co), ruthenium (Ru), silver (Ag), gold (Au), manganese (Mn), and molybdenum (Mo).

The second wiring pattern 420 may be disposed on the via structure 410. The second wiring pattern 420 may be a multilayer including a second wiring barrier layer 420a and a second wiring filling layer 420b.

The second wiring filling layer 420b may be disposed on the second wiring barrier layer 420a. The second wiring barrier layer 420a may be disposed along sidewalls and a bottom surface of the second wiring filling layer 420b. The description of materials included in the second wiring barrier layer 420a and the second wiring filling layer 420b may be the same as the description of the materials included in the first wiring barrier layer 310a and the first wiring filling layer 310b.

Figure 5:
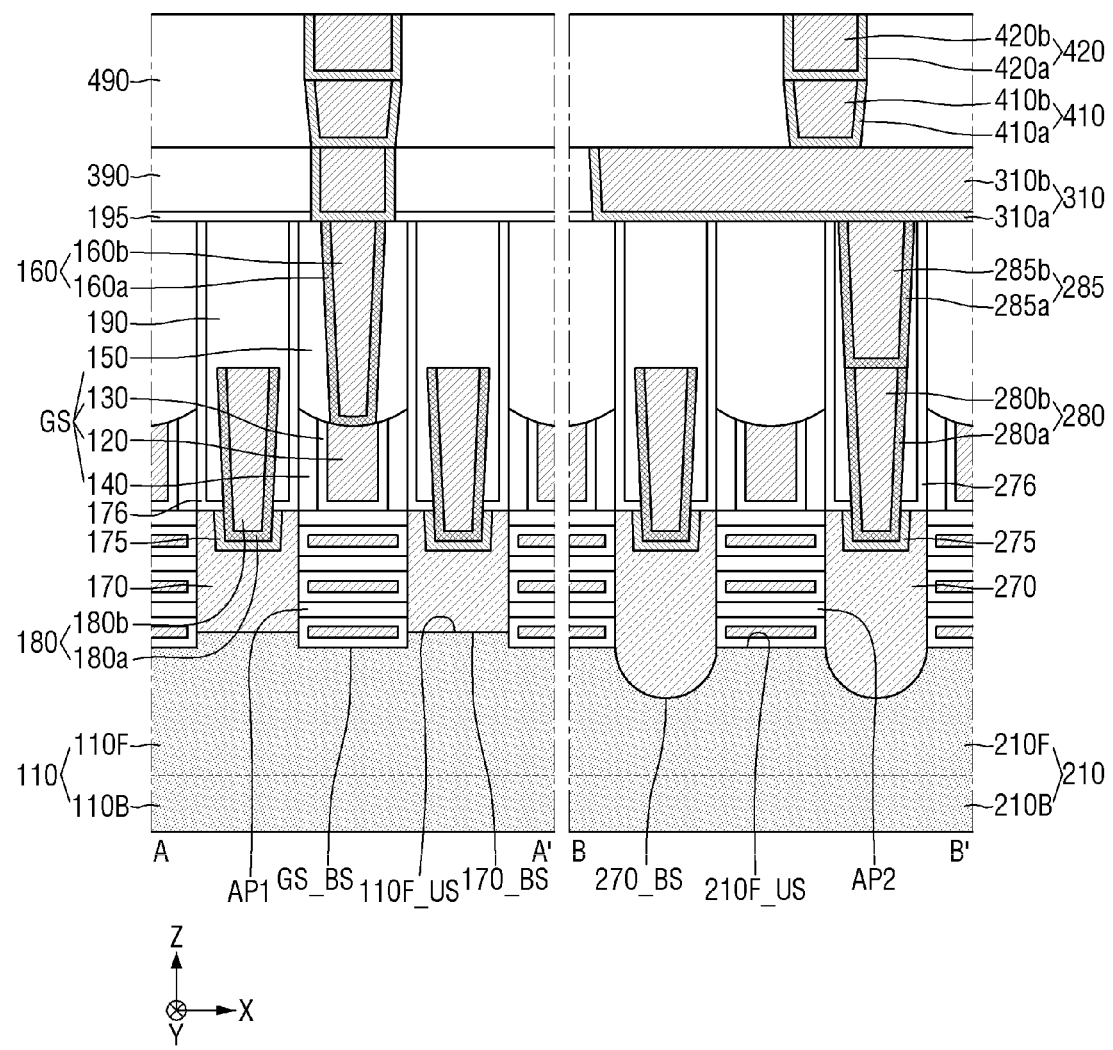
FIG. 5 illustrates a semiconductor device according to embodiments.

FIG. 5 illustrates a semiconductor device according to embodiments. For ease of description, differences from the semiconductor device described above with reference to FIGS. 1 through 4 will be mainly described. For reference, FIG. 5 may be a cross-sectional view taken along the lines A-A' and B-B' of FIG. 1.

Referring to FIG. 5, bottom surfaces 170_BS of first source/drain patterns 170 may overlap a gate structure GS in the first direction X.

In some embodiments, the bottom surfaces 170_BS of the first source/drain patterns 170 may be formed to be higher than a bottom surface GS_BS of the gate structure GS. That is, the bottom surfaces 170_BS of the first source/drain patterns 170 may be higher than the bottom surface GS_BS of the gate structure GS relative to upper surfaces of lower insulating layers 110B and 210B. The bottom surfaces 170_BS of the first source/drain patterns 170 may overlap a gate electrode 120 in the first direction X. Although not illustrated, the bottom surfaces 170_BS of the first source/drain patterns 170 may overlap a gate insulating layer 130 in the first direction X.

In some embodiments, at least a part of a first fin-shaped insulating layer 110F may overlap the gate structure GS in the first direction X. At least a part of the first fin-shaped insulating layer 110F may overlap the gate electrode 120 in the first direction X. At least a part of the first fin-shaped insulating layer 110F may overlap the gate insulating layer 130 in the first direction X. In a process of removing a silicon substrate, the first source/drain patterns 170 may be excessively recessed so that the bottom surfaces 170_BS of the first source/drain patterns 170 are formed to be higher than the bottom surface GS_BS of the gate structure GS.

Figure 6:
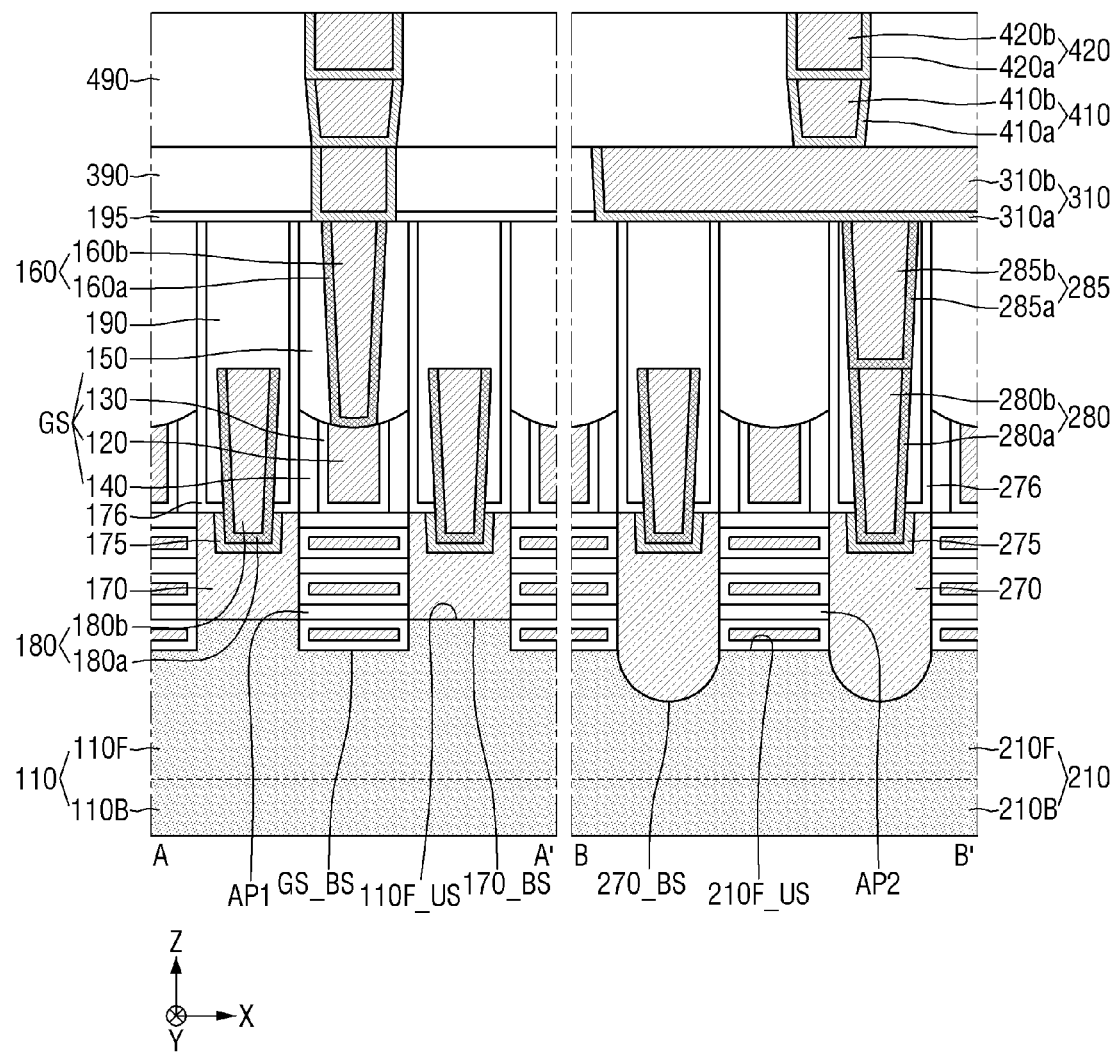
FIG. 6 illustrates a semiconductor device according to embodiments.

FIG. 6 illustrates a semiconductor device according to embodiments. For ease of description, differences from the semiconductor device described above with reference to FIGS. 1 through 4 will be mainly described. For reference, FIG. 6 may be a cross-sectional view taken along the lines A-A' and B-B' of FIG. 1.

Referring to FIG. 6, bottom surfaces 170_BS of first source/drain patterns 170 may lie in the same plane as a bottom surface of the first active patterns AP1.

An upper surface 110F_BS of a first fin-shaped insulating layer 110F may lie in the same plane as the bottom surface of the first active patterns AP1. The first fin-shaped insulating layer 110F does not overlap the first active patterns AP1 in the first direction X. At least a part of the first fin-shaped insulating layer 110F may overlap a gate electrode 120 and a gate insulating layer 130 in the first direction X. The first active patterns AP1 may completely overlap the first source/drain patterns 170 in the first direction X.

Figure 7:
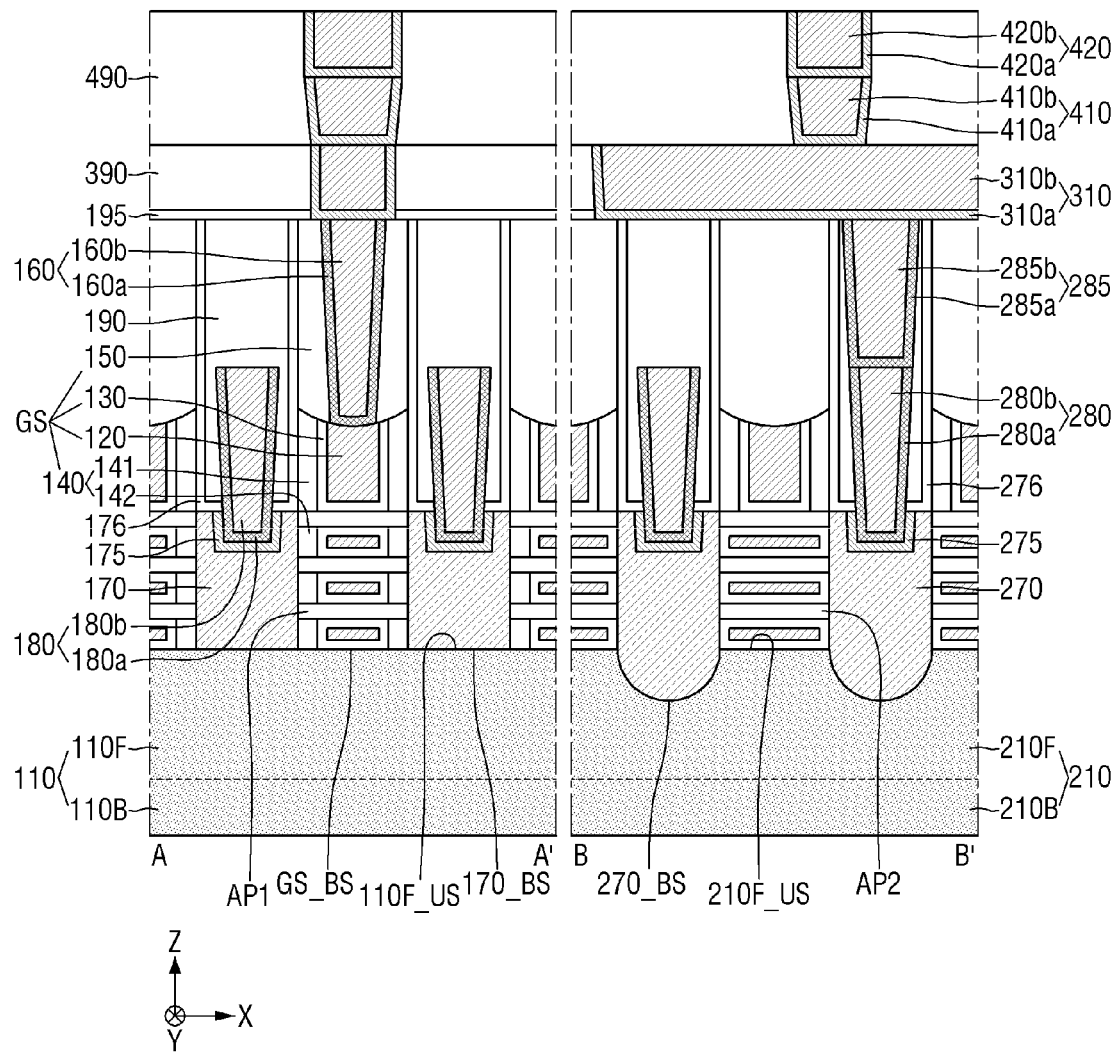
FIG. 7 illustrates a semiconductor device according to embodiments.

FIG. 7 illustrates a semiconductor device according to embodiments. For ease of description, differences from the semiconductor device described above with reference to FIGS. 1 through 4 will be mainly described. For reference, FIG. 7 may be a cross-sectional view taken along the lines A-A' and B-B' of FIG. 1.

Referring to FIGS. 1 and 7, gate spacers 140 of a first active region RX1 may include outer spacers 141 and inner spacers 142. Gate spacers 140 of a second active region RX2 may not include inner spacers.

In some embodiments, a transistor formed in the first active region RX1 may be an NMOS transistor. A transistor formed in the second active region RX2 may be a PMOS transistor. In the case of an NMOS transistor, the gate spacers 140 may include the inner spacers 142. In the case of a PMOS transistor, the gate spacers 140 may not include inner spacers.

Figure 8:
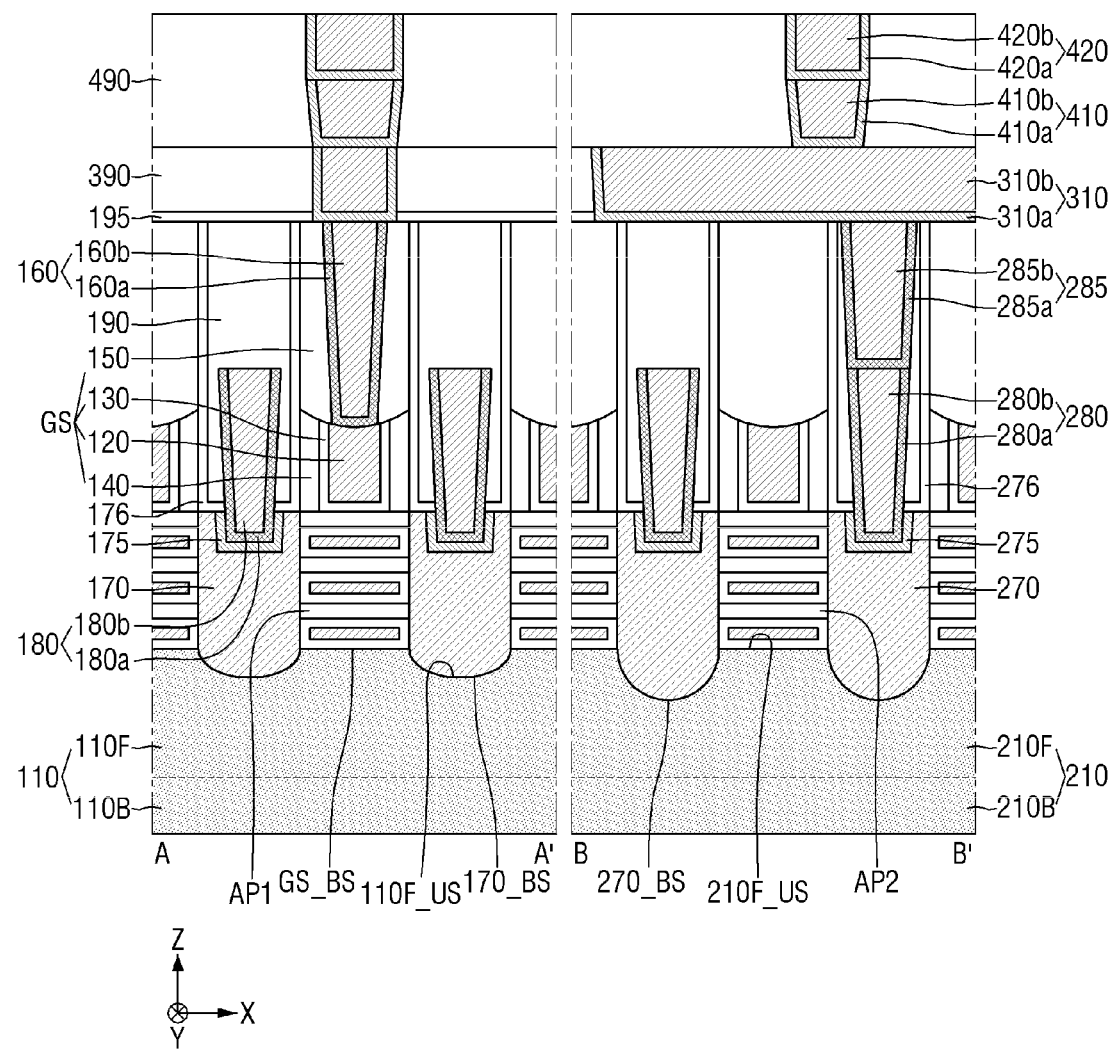
FIG. 8 illustrates a semiconductor device according to embodiments.

FIG. 8 illustrates a semiconductor device according to embodiments. For ease of description, differences from the semiconductor device described above with reference to FIGS. 1 through 4 will be mainly described. For reference, FIG. 8 may be a cross-sectional view taken along the lines A-A' and B-B' of FIG. 1.

Referring to FIG. 8, bottom surfaces 170_BS of first source/drain patterns 170 may be formed to be lower than a bottom surface GS_BS of a gate structure GS.

For example, the bottom surfaces 170_BS of the first source/drain patterns 170 may be lower than the bottom surface GS_BS of the gate structure GS relative to upper surfaces of lower insulating layers 110B and 210B.

At least a part of each of the first source/drain patterns 170 may overlap a first fin-shaped insulating layer 110F in the first direction X. The first fin-shaped insulating layer 110F may not overlap the gate structure GS in the first direction X.

Although the bottom surfaces 170_BS of the first source/drain patterns 170 are convex toward a first lower insulating layer 110B in the drawing, this is merely an example used for ease of description, and the present disclosure is not limited to this example.

In some embodiments, the bottom surfaces 170_BS of the first source/drain patterns 170 may be higher than bottom surfaces 270_BS of second source/drain patterns 270. That is, the bottom surfaces 170_BS of the first source/drain patterns 170 may be higher than the bottom surfaces 270_BS of the second source/drain patterns 270 relative to the upper surfaces of the lower insulating layers 110B and 210B. A height/thickness of the first source/drain patterns 170 in the third direction Z may be smaller than a height/thickness of the second source/drain patterns 270 in the third direction Z.

Figure 9:
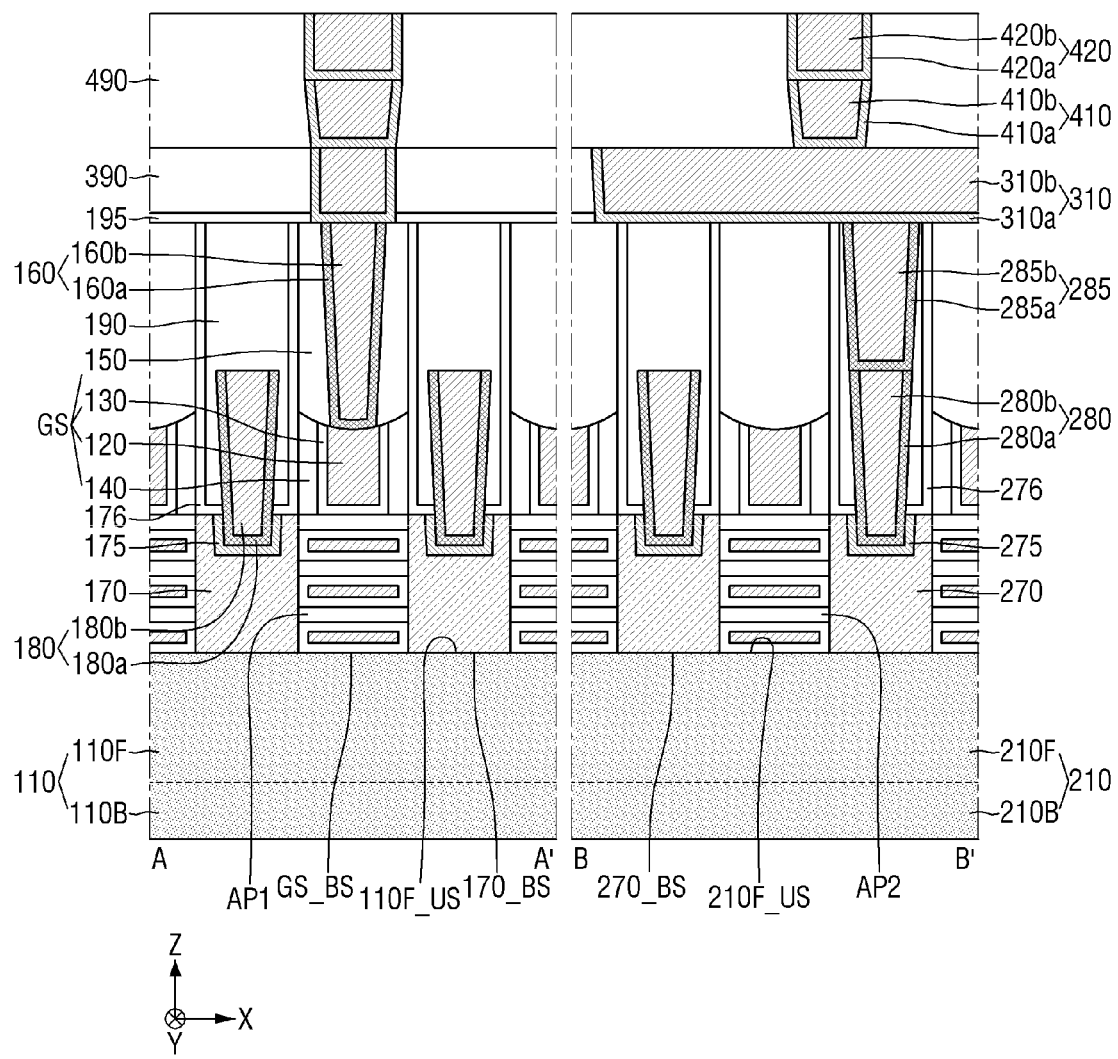
FIG. 9 illustrates a semiconductor device according to embodiments.
Figure 10:
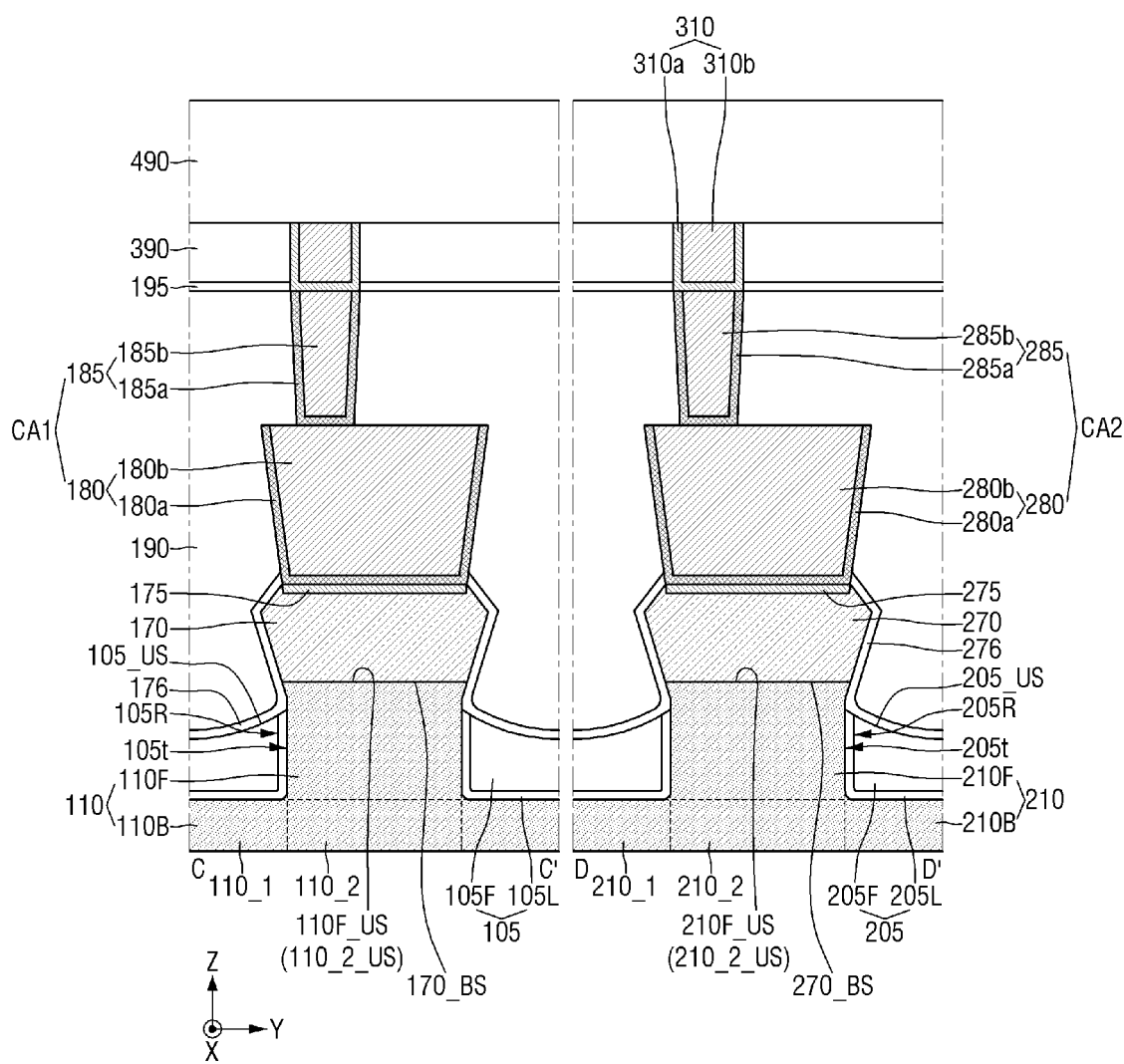
FIG. 10 illustrates a semiconductor device according to embodiments.

FIG. 9 illustrates a semiconductor device according to embodiments. FIG. 10 illustrates the semiconductor device according to the embodiments. For ease of description, differences from the semiconductor device described above with reference to FIGS. 1 through 4 will be mainly described. For reference, FIG. 9 may be a cross-sectional view taken along the lines A-A' and B-B' of FIG. 1. FIG. 10 may be a cross-sectional view taken along the lines C-C' and D-D' of FIG. 1.

Referring to FIGS. 9 and 10, bottom surfaces 270_BS of second source/drain patterns 270 may lie in the same plane as a bottom surface GS_BS of a gate structure GS.

For example, bottom surfaces 170_BS of first source/drain patterns 170, the bottom surface GS_BS of the gate structure GS, and the bottom surfaces 270_BS of the second source/drain patterns 270 may lie in the same plane. The bottom surfaces 270_BS of the second source/drain patterns 270 may be flat surfaces with respect to (e.g., may be parallel with) an upper surface of a second lower insulating layer 210B.

A height of the first source/drain patterns 170 in the third direction Z may be the same as a height of the second source/drain patterns 270 in the third direction Z.

Figure 11:
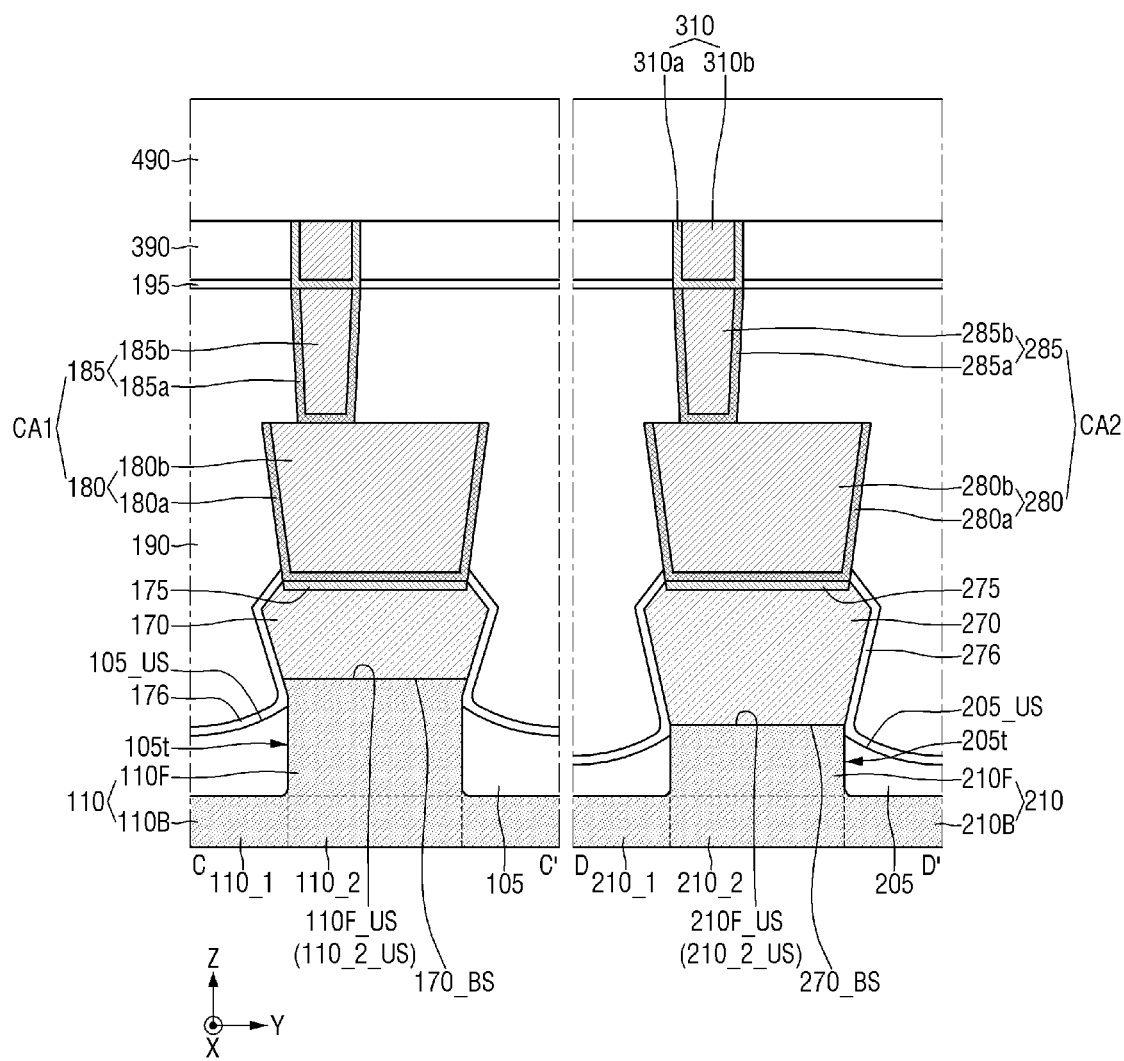
FIG. 11 illustrates a semiconductor device according to embodiments.
Figure 12:
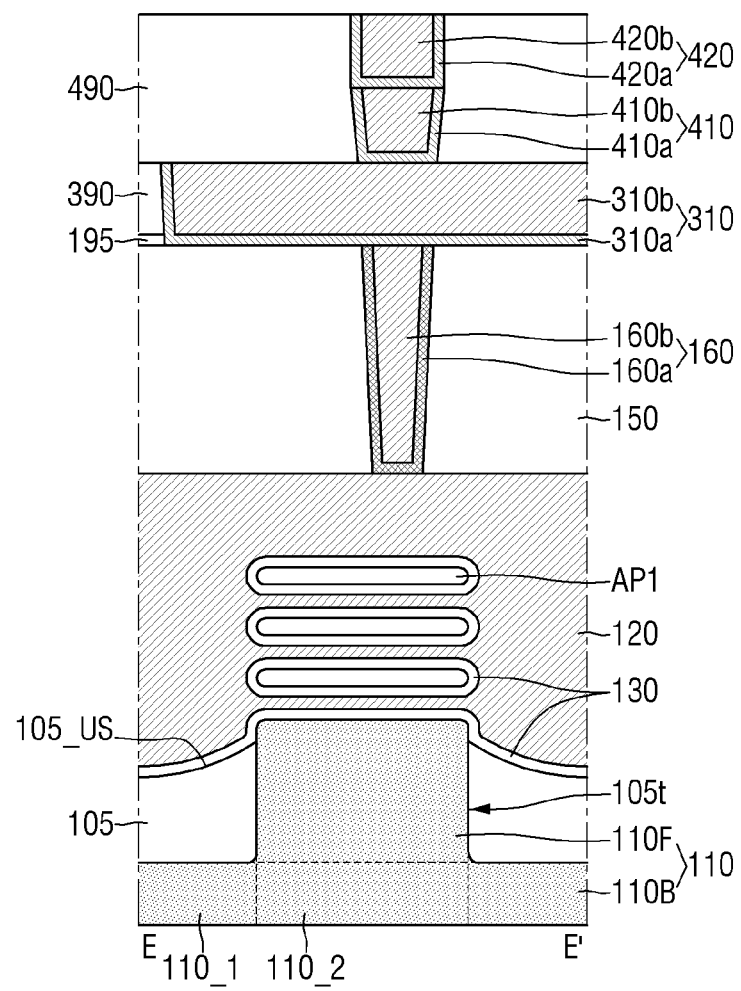
FIG. 12 illustrates a semiconductor device according to embodiments.

FIG. 11 illustrates a semiconductor device according to embodiments. FIG. 12 illustrates the semiconductor device according to the embodiments. For ease of description, differences from the semiconductor device described above with reference to FIGS. 1 through 4 will be mainly described. For reference, FIG. 11 may be a cross-sectional view taken along the lines C-C' and D-D' of FIG. 1. FIG. 12 may be a cross-sectional view taken along the line E-E' of FIG. 1.

Referring to FIGS. 11 and 12, a first field insulating layer 105 and a second field insulating layer 205 may not include a first field liner layer 105L and a second field liner layer 205L, respectively.

That is, each of the first field insulating layer 105 and the second field insulating layer 205 may be a single layer. An upper surface 105_US of the first field insulating layer 105 may be a curved surface convex toward a first lower insulating layer 110IB. Accordingly, those of ordinary skill in the art can distinguish a first fin-shaped insulating layer 110F from the first field insulating layer 105.

An upper surface 205_US of the second field insulating layer 205 may be a curved surface convex toward a second lower insulating layer 210B. Likewise, those of ordinary skill in the art can distinguish a second fin-shaped insulating layer 210F from the second field insulating layer 205.

Each of the first field insulating layer 105 and the second field insulating layer 205 may include, for example, a silicon oxide layer, a silicon nitride layer, a silicon oxynitride layer, or a combination of the same.

Figure 13A:
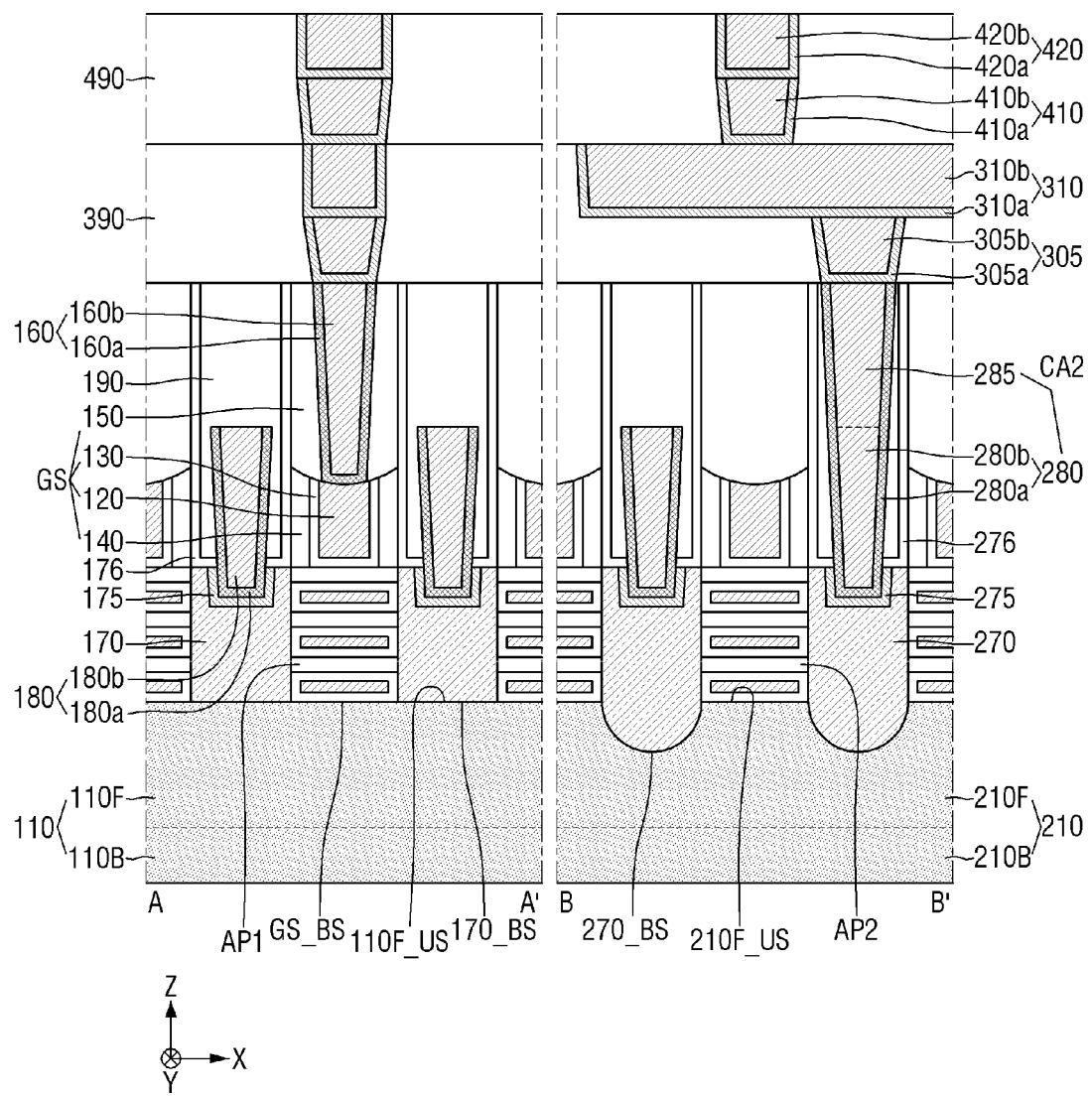
FIGS. 13A and 13B illustrate a semiconductor device according to embodiments.
Figure 13B:
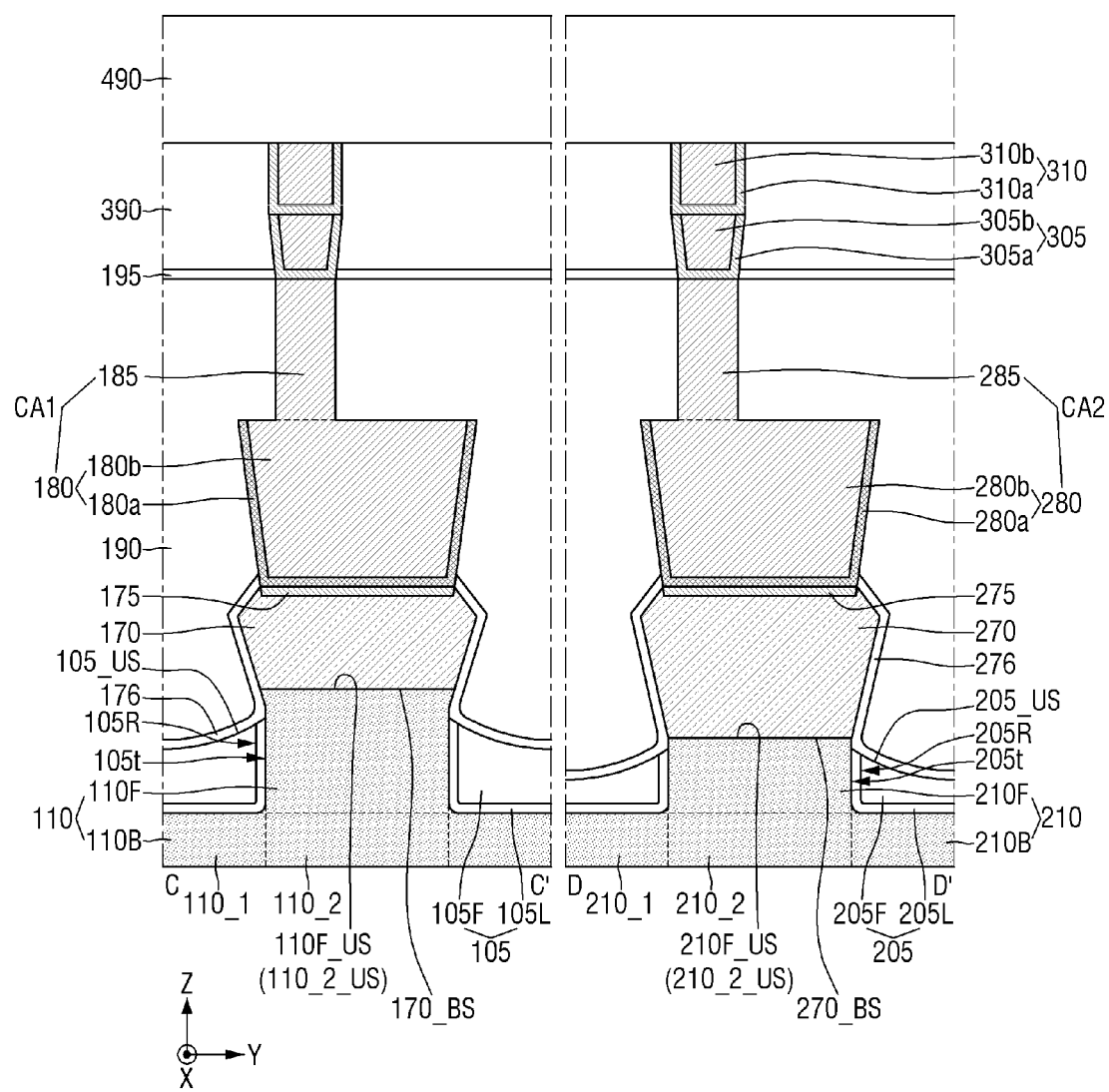

FIGS. 13A and 13B illustrate a semiconductor device according to embodiments. For ease of description, differences from the semiconductor device described above with reference to FIGS. 1 through 4 will be mainly described. For reference, FIG. 13A may be a cross-sectional view taken along the lines A-A' and B-B' of FIG. 1. FIG. 13B may be a cross-sectional view taken along the lines C-C' and D-D' of FIG. 1.

Referring to FIGS. 13A and 13B, each of a first upper active contact 185 and a second upper active contact 285 may be formed as a single layer.

A first lower active contact liner layer 180a may extend to an upper surface of a gate capping pattern 150 and an upper surface of a first interlayer insulating layer 190. A second lower active contact liner layer 280a may extend to the upper surface of the gate capping pattern 150 and the upper surface of the first interlayer insulating layer 190.

In some embodiments, the semiconductor device of the present disclosure may further include a via contact 305. The via contact 305 may connect a first gate contact 160 and a first wiring pattern 310 in a first active region RX1. The via contact 305 may connect a second active contact CA2 and the first wiring pattern 310 in a second active region RX2.

The via contact 305 may be a multilayer including a via contact barrier layer 305a and a via contact filling layer 305b. The via contact filling layer 305b may be disposed on the via contact barrier layer 305a. The via contact barrier layer 305a may be disposed along sidewalls and a bottom surface of the via contact filling layer 305b.

The via contact barrier layer 305a may include at least one of, for example, tantalum (Ta), tantalum nitride (TaN), titanium (Ti), titanium nitride (TiN), titanium silicon nitride (TiSiN), ruthenium (Ru), cobalt (Co), nickel (Ni), nickel boron (NiB), tungsten (W), tungsten nitride (WN), tungsten carbonitride (WCN), zirconium (Zr), zirconium nitride (ZrN), vanadium (V), vanadium nitride (VN), niobium (Nb), niobium nitride (NbN), platinum (Pt), iridium (Ir), rhodium (Rh), and a 2D material.

The via contact filling layer 305b may include at least one of, for example, aluminum (Al), copper (Cu), tungsten (W), cobalt (Co), ruthenium (Ru), silver (Ag), gold (Au), manganese (Mn), and molybdenum (Mo).

Figure 14:
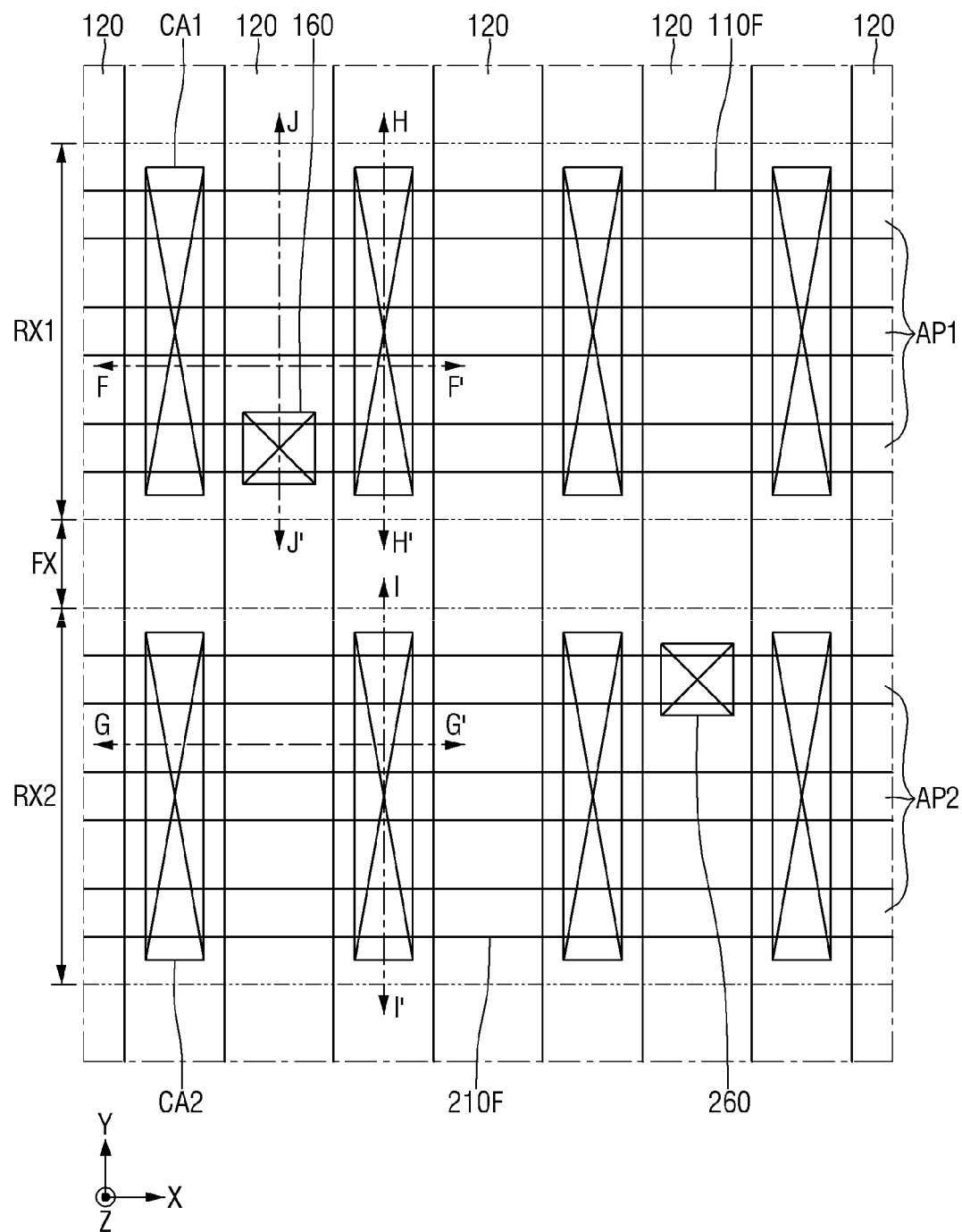
FIG. 14 is an example layout view of a semiconductor device according to embodiments.
Figure 15:
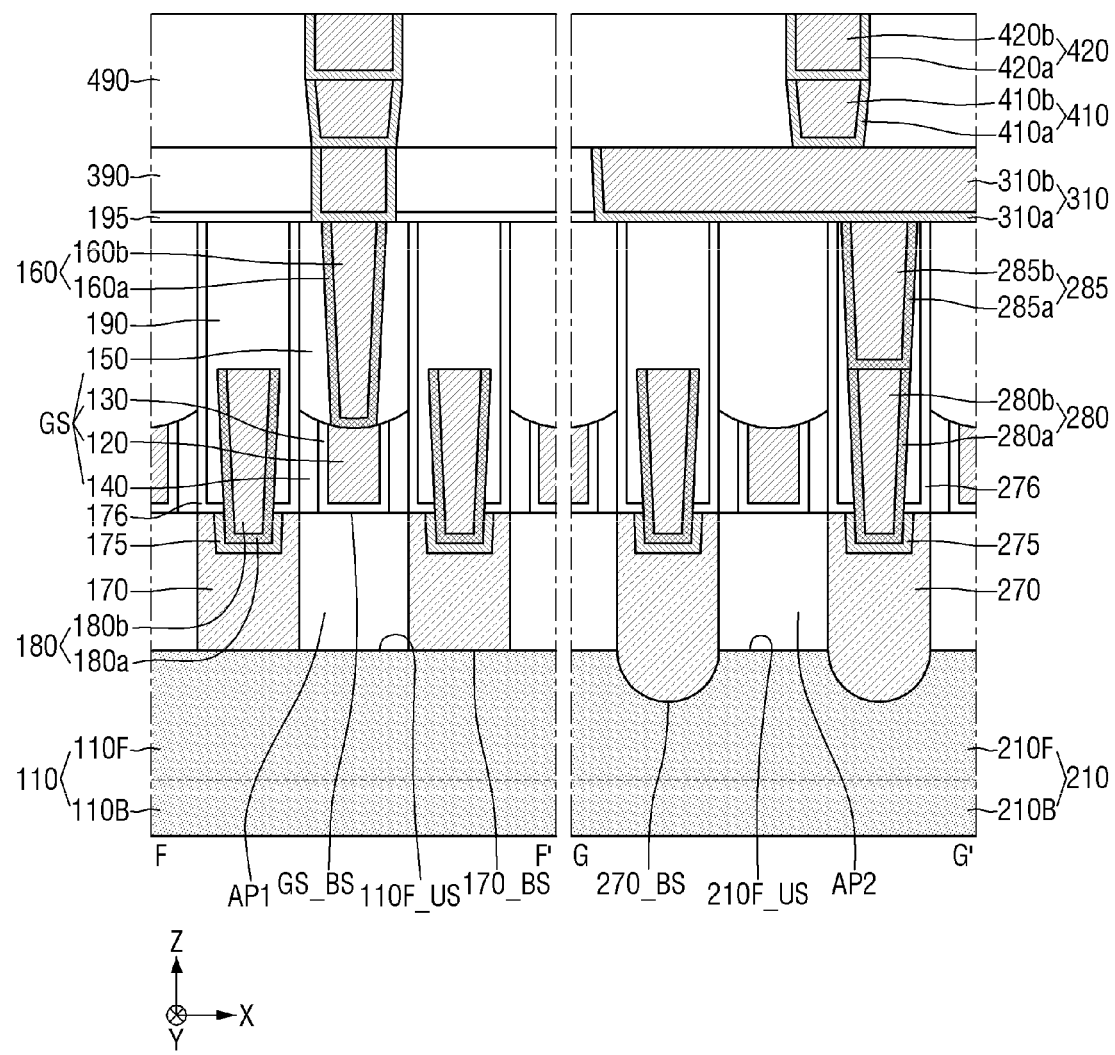
FIG. 15 is a cross-sectional view taken along lines F-F' and G-G' of FIG. 14.
Figure 16:
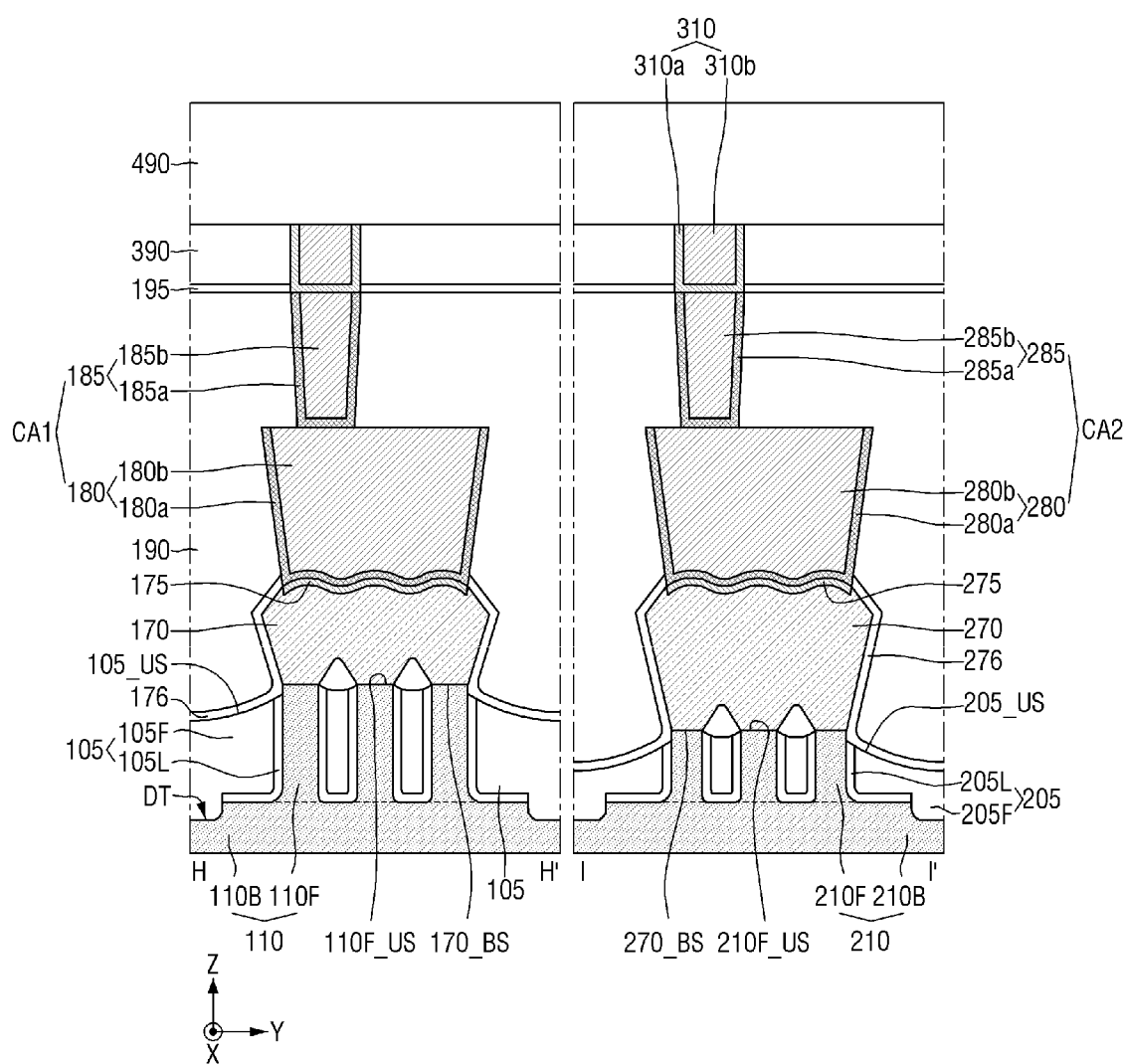
FIG. 16 is a cross-sectional view taken along lines H-H' and I-I' of FIG. 14.
Figure 17:
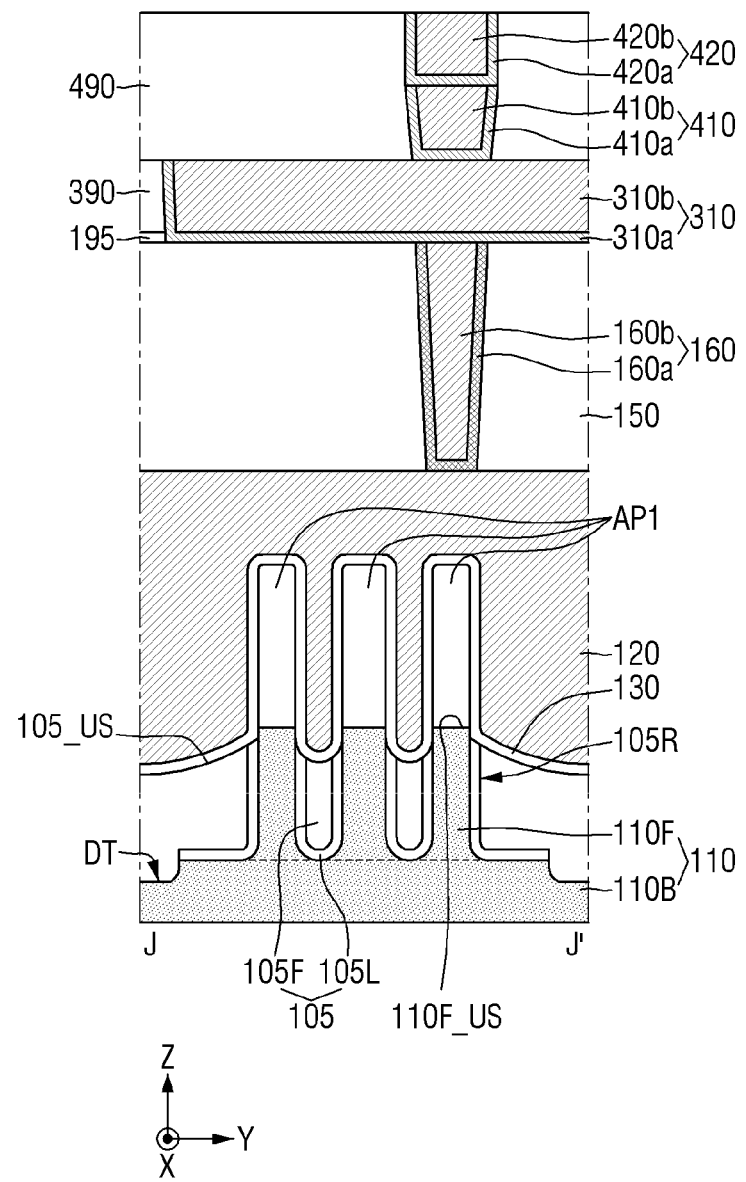
FIG. 17 is an example cross-sectional view taken along line J-J' of FIG. 14.

FIG. 14 is an example layout view of a semiconductor device according to embodiments. FIG. 15 is a cross-sectional view taken along lines F-F' and G-G' of FIG. 14. FIG. 16 is a cross-sectional view taken along lines H-H' and I-I' of FIG. 14. FIG. 17 is an example cross-sectional view taken along line J-J' of FIG. 14. For ease of description, differences from the semiconductor device described above with reference to FIGS. 1 through 4 will be mainly described.

Referring to FIGS. 14 through 17, the semiconductor device according to the embodiments may include first active patterns AP1 and second active patterns AP2.

In FIGS. 14 and 16, three first active patterns AP1 and three second active patterns AP2 are illustrated. However, this is merely an example used for ease of description, and the present disclosure is not limited to this example. The number of first active patterns AP1 and the number of second active patterns AP2 may each be more than one.

As illustrated in FIGS. 14 and 16, a field region FX may be defined by a deep trench DT, but the present disclosure is not limited thereto. Further, those of ordinary skill in the art to which the present disclosure pertains can distinguish which part is a field region and which part is an active region.

A first field insulating layer 105 may be formed on a first lower insulating layer 110B. A second field insulating layer 205 may be formed on a second lower insulating layer 210B. The first and second field insulating layers 105 and 205 may be formed across a first active region RX1, a second active region RX2, and the field region FX. The first and second field insulating layers 105 and 205 may fill the deep trench DT.

In FIG. 15, a first fin-shaped insulating layer 110F may contact a first active pattern AP1. The first active pattern AP1 may be disposed between a bottom surface GS_BS of a gate structure GS and an upper surface 110F_US of the first fin-shaped insulating layer 110F. The upper surface 110F_US of the first fin-shaped insulating layer 110F may lie in the same plane as a bottom surface of the first active pattern AP1 and bottom surfaces 170_BS of first source/drain patterns 170. However, the present disclosure is not limited thereto.

Although not illustrated, at least a part of the first fin-shaped insulating layer 110F may overlap the first source/drain patterns 170 in the first direction X.

A second fin-shaped insulating layer 210F may contact a second active pattern AP2. The second active pattern AP2 may be disposed between the bottom surface GS_BS of the gate structure GS and an upper surface 210F_US of the second fin-shaped insulating layer 210F. The upper surface 210F_US of the second fin-shaped insulating layer 210F may be formed to be higher than bottom surfaces 270_BS of second source/drain patterns 270. The upper surface 210F_US of the second fin-shaped insulating layer 210F may be higher than the bottom surfaces 270_BS of the second source/drain patterns 270 relative to an upper surface of the second lower insulating layer 210B. However, the present disclosure is not limited thereto.

Each of the first and second source/drain patterns 170 and 270 is a result of merging three epitaxial patterns formed on the first active pattern AP1 or the second active pattern AP2 as illustrated in the drawings. However, this is merely an example used for ease of description, and the present disclosure is not limited thereto. That is, the epitaxial patterns formed on each of the first and second active patterns AP1 and AP2 may also be spaced apart from each other.

In some embodiments, an air gap may be disposed in a space between the first field insulating layer 105 and each of the first source/drain patterns 170 merged with the first field insulating layer 105. An air gap may be disposed in a space between the second field insulating layer 205 and each of the second source/drain patterns 270 merged with the second field insulating layer 205. Alternatively, an insulating material may fill the space between the first field insulating layer 105 and each of the first source/drain patterns 170 merged with the first field insulating layer 105. An insulating material may fill the space between the second field insulating layer 205 and each of the second source/drain patterns 270 merged with the second field insulating layer 205.

In some embodiments, a first field liner layer 105L may not be disposed on sidewalls and a bottom surface of the deep trench DT. A second field liner layer 205L may not be disposed on the sidewalls and bottom surface of the deep trench DT. However, the present disclosure is not limited thereto.

FIGS. 18 through 35 illustrate operations in a method of manufacturing a semiconductor device according to embodiments. The method of manufacturing the semiconductor device according to the embodiments will now be described with reference to FIGS. 18 through 33.

Figure 18:
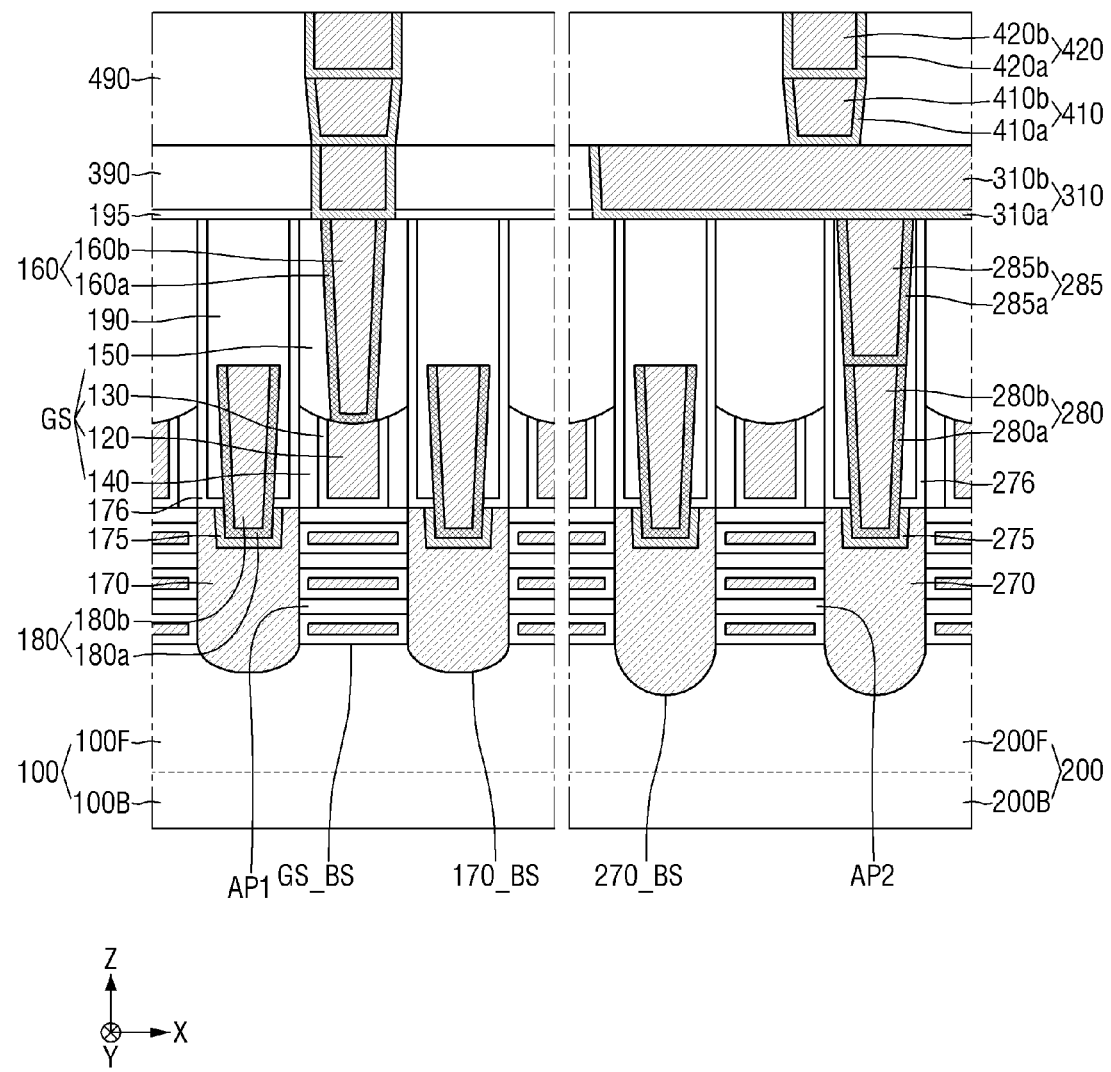
FIGS. 18 through 35 illustrate operations in a method of manufacturing a semiconductor device according to embodiments.
Figure 19:
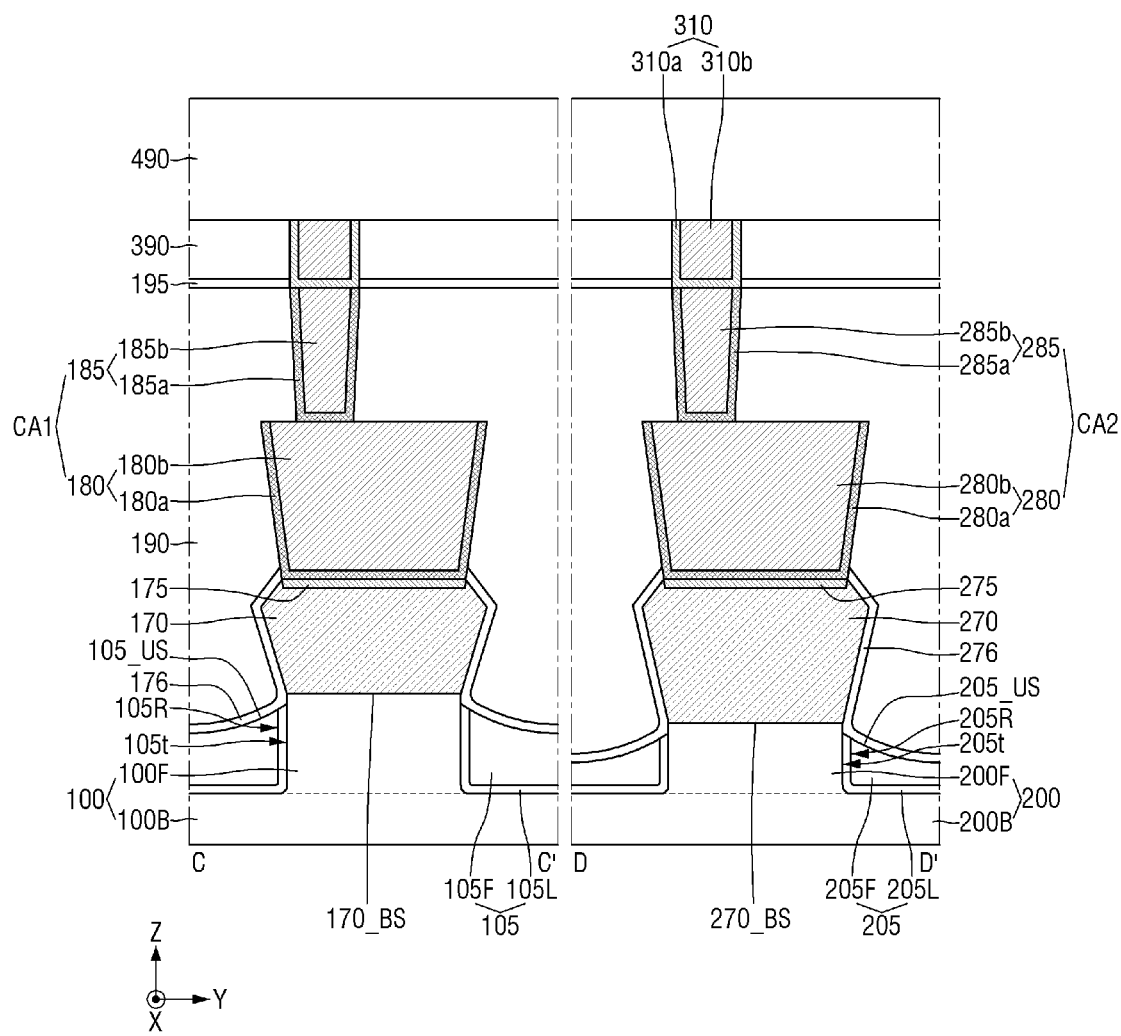
Figure 20:
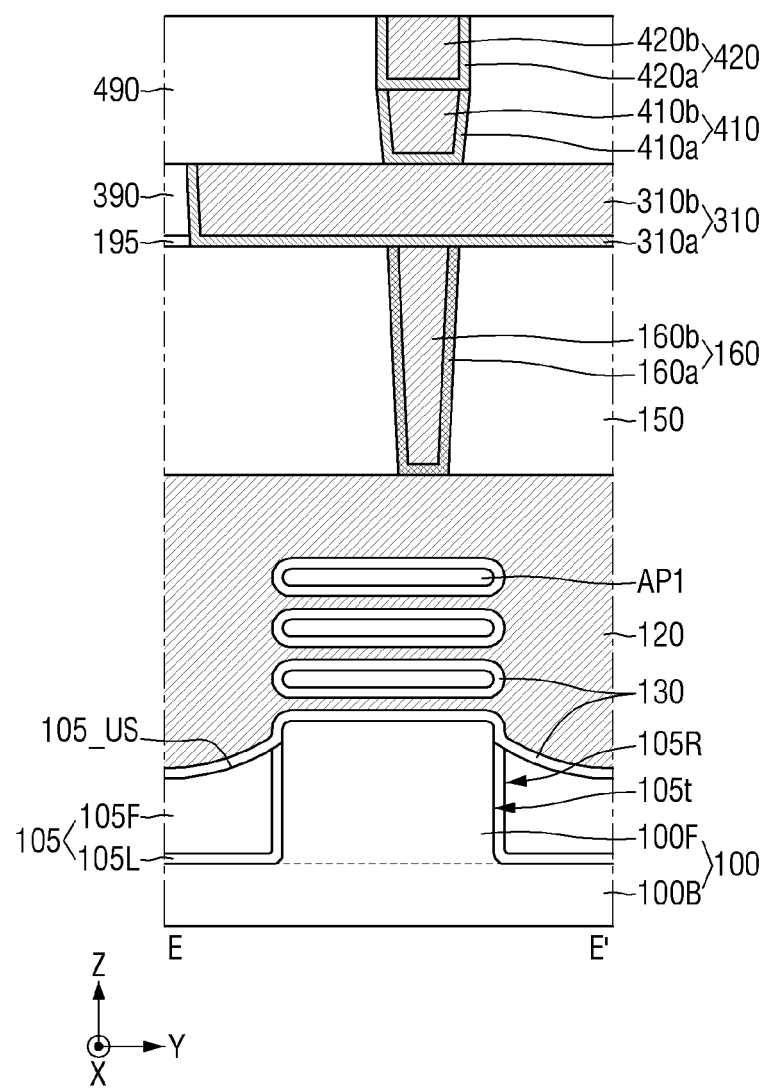

Referring to FIGS. 18 through 20, a gate structure GS, first source/drain patterns 170, first active patterns AP1, a first active contact CA1, and a first gate contact 160 may be formed on a first substrate 100.

The gate structure GS, second source/drain patterns 270, second active patterns AP2, and a second active contact CA2 may be formed on a second substrate 200.

The first substrate 100 may include a first lower substrate 100B and a first fin-shaped substrate 100F. The second substrate 200 may include a second lower substrate 200B and a second fin-shaped substrate 200F.

The first fin-shaped substrate 100F may extend in the first direction X on the first lower substrate 100B. The second fin-shaped substrate 200F may extend in the first direction X on the second lower substrate 200B. For example, each of the first fin-shaped substrate 100F and the second fin-shaped substrate 200F may include long sides extending in the first direction X and short sides extending in the second direction Y.

Each of the first lower substrate 100B and the second lower substrate 200B may be, for example, a silicon substrate or a silicon-on-insulator (SOI) substrate. Otherwise, each of the first lower substrate 100B and the second lower substrate 200B may include, but is not limited to, silicon germanium, silicon germanium on insulator (SGOI), indium antimonide, lead telluride, indium arsenide, indium phosphide, gallium arsenide, or gallium antimonide.

Each of the first fin-shaped substrate 100F and the second fin-shaped substrate 200F may be a part of the first lower substrate 100B or the second lower substrate 200B or may include an epitaxial layer grown from the first lower substrate 100B or the second lower substrate 200B.

The first fin-shaped substrate 100F and the second fin-shaped substrate 200F may include an elemental semiconductor material such as silicon or germanium. Alternatively, the first fin-shaped substrate 100F and the second fin-shaped substrate 200F may include a compound semiconductor such as a group IV-IV compound semiconductor or a group III-V compound semiconductor.

The group IV-IV compound semiconductor may be, e.g., a binary or ternary compound including two or more of carbon (C), silicon (Si), germanium (Ge) and tin (Sn) or a compound obtained by doping the binary or ternary compound with a group IV element.

The group III-V compound semiconductor may be, e.g., a binary, ternary, or quaternary compound formed of at least one of aluminum (Al), gallium (Ga) and indium (In) (i.e., group III elements) bonded with one of phosphorus (P), arsenic (As) and antimony (Sb) (i.e., group V elements).

One or more gate structures GS may be formed on the first fin-shaped substrate 100F and the second fin-shaped substrate 200F. The gate structures GS may intersect the first fin-shaped substrate 100F and the second fin-shaped substrate 200F. The gate structures GS may extend in the second direction Y intersecting the first fin-shaped substrate 100F and the second fin-shaped substrate 200F. Each of the gate structures GS may include long sides extending in the second direction Y and short sides extending in the first direction X.

The first source/drain patterns 170 and the second source/drain patterns 270 may be disposed on the first substrate 100 and the second substrate 200 between the gate structures GS.

Figure 21:
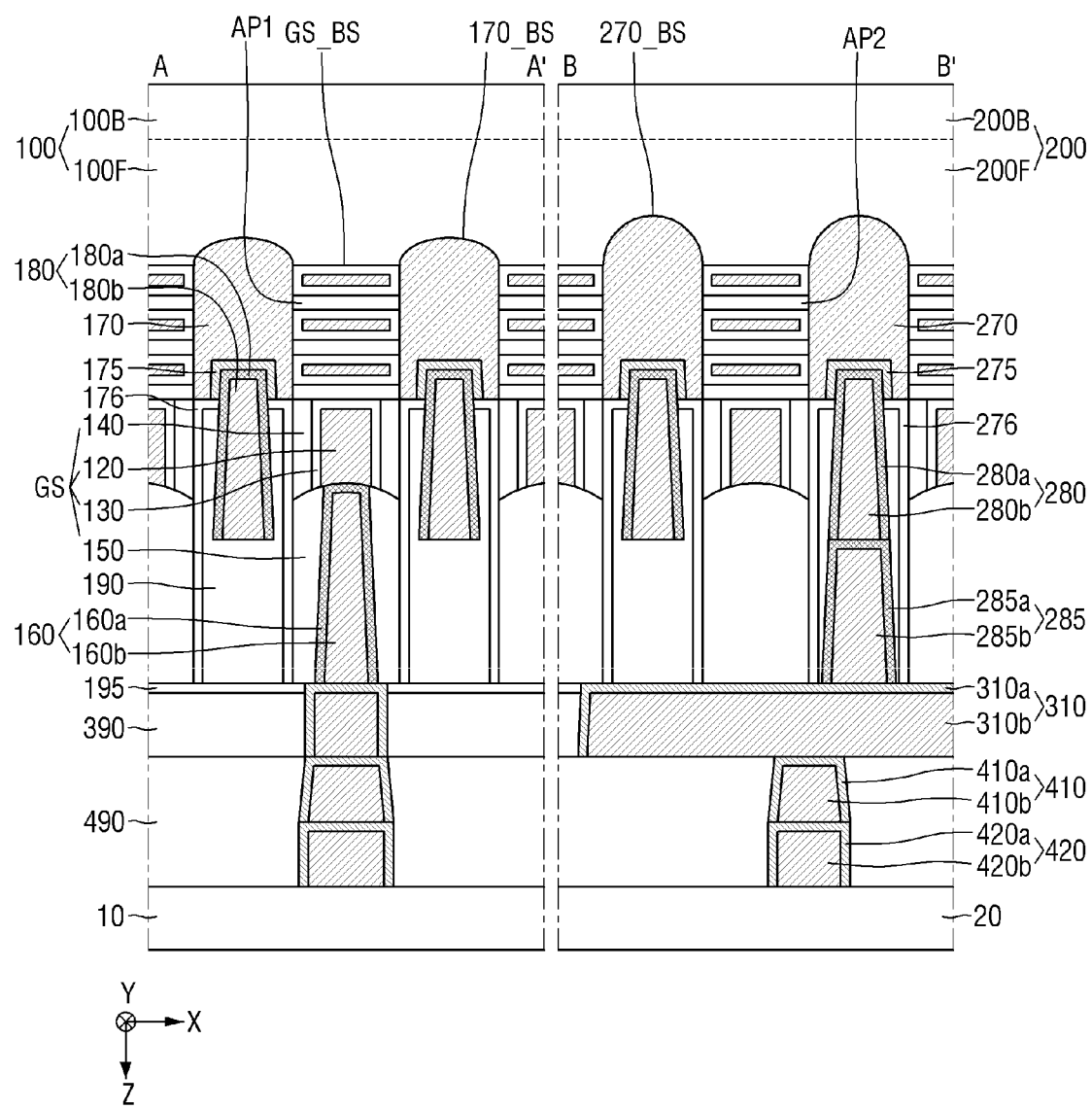
Figure 22:
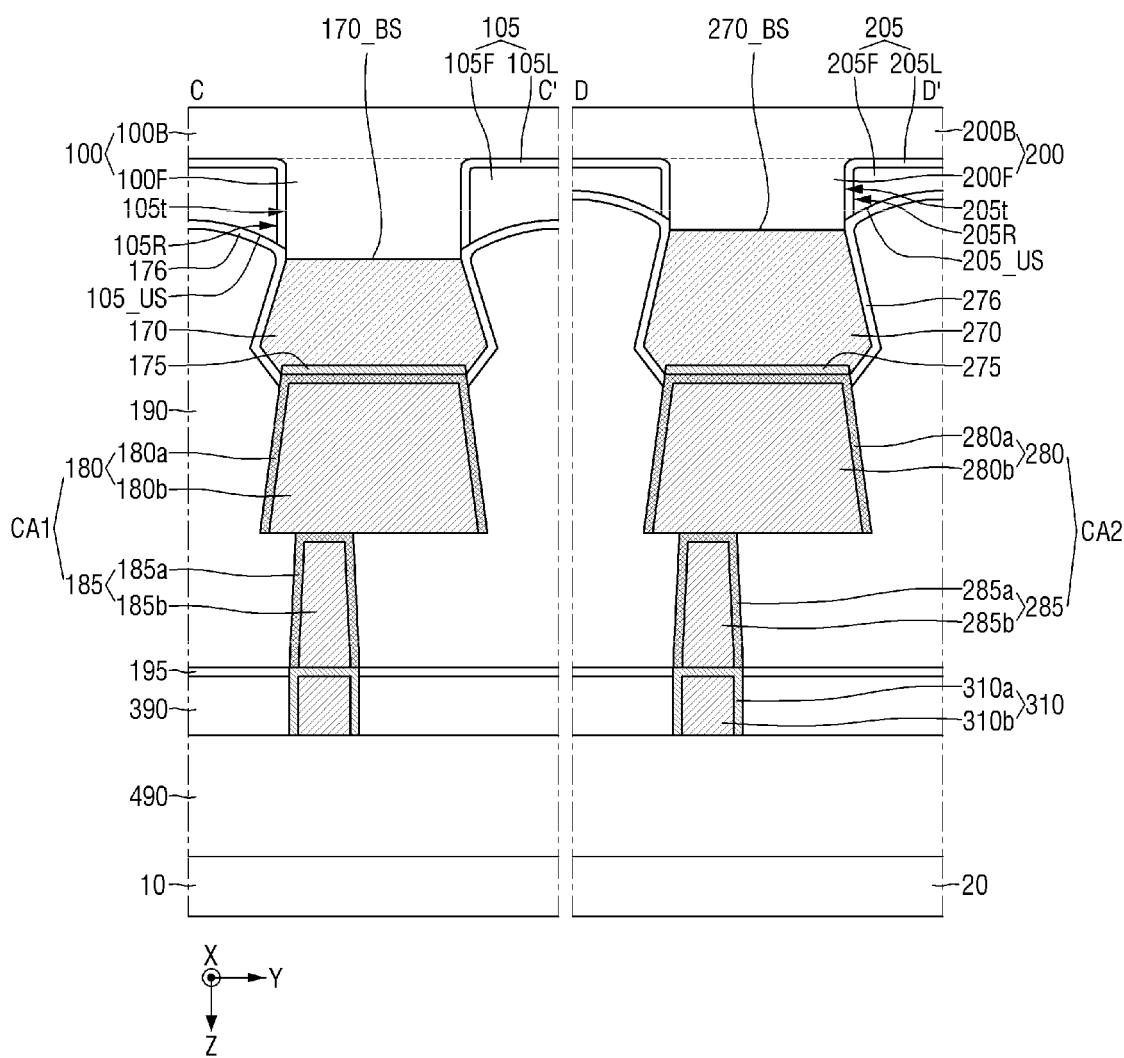
Figure 23:
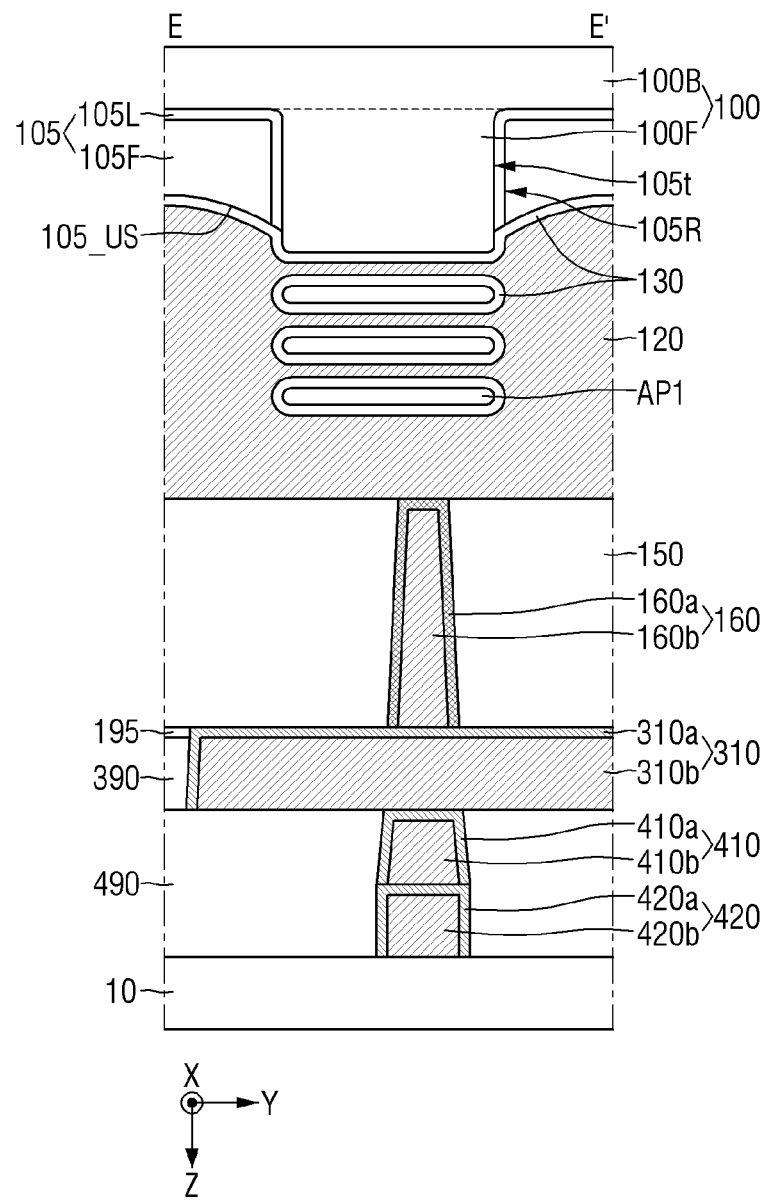

Referring to FIGS. 21 through 23, support substrates 10 and 20 may be formed on a third interlayer insulating layer 490. The support substrates 10 and 20 may support the semiconductor structure of the present disclosure during a process of forming first and second insulating layers 110 and 210.

A first support substrate 10 may be formed on the third interlayer insulating layer 490 of a first active region RX1. A second support substrate 20 may be formed on the third interlayer insulating layer 490 of a second active region RX2.

The first support substrate 10 and the second support substrate 20 may include, for example, silicon. However, the present disclosure is not limited thereto.

Figure 24:
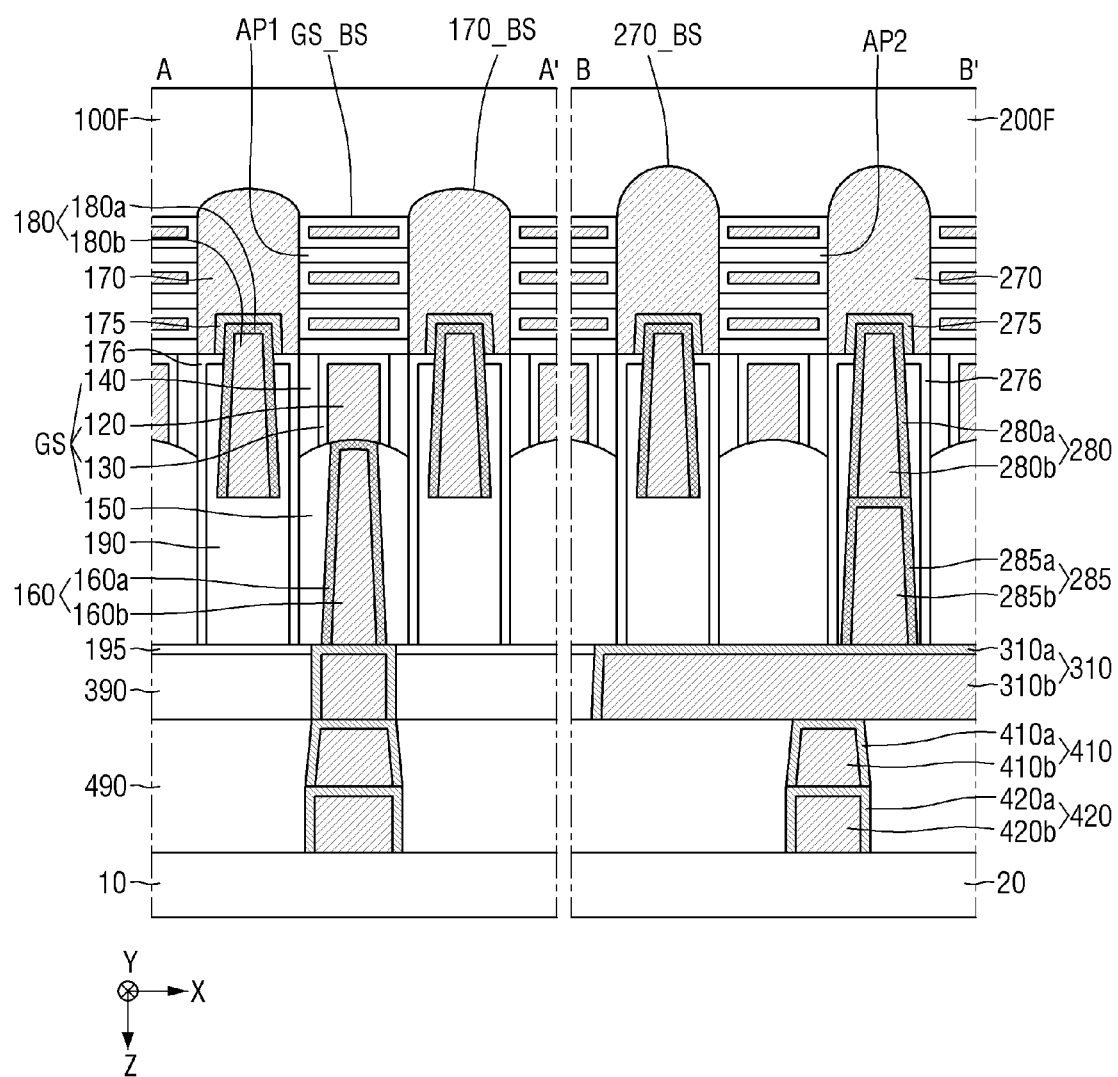
Figure 25:
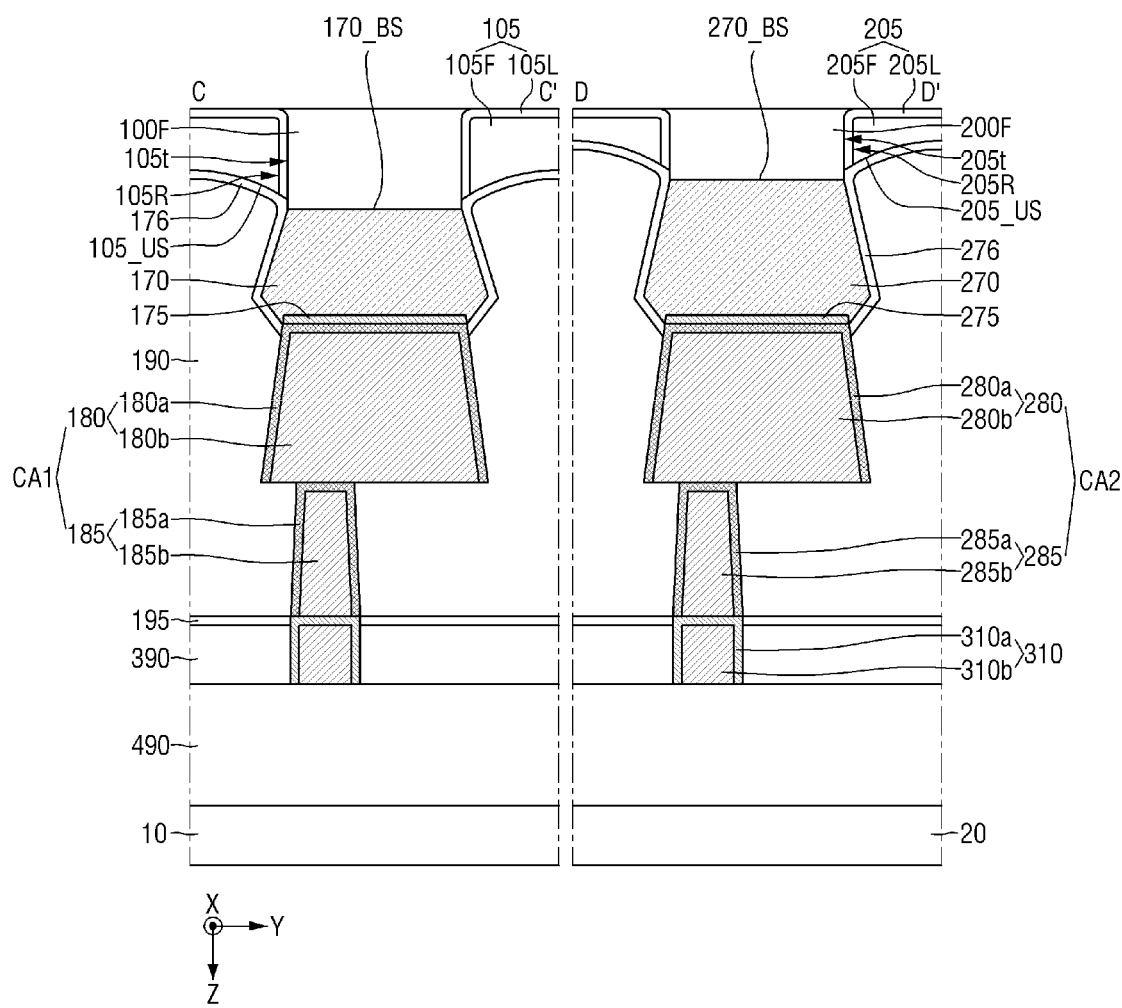
Figure 26:
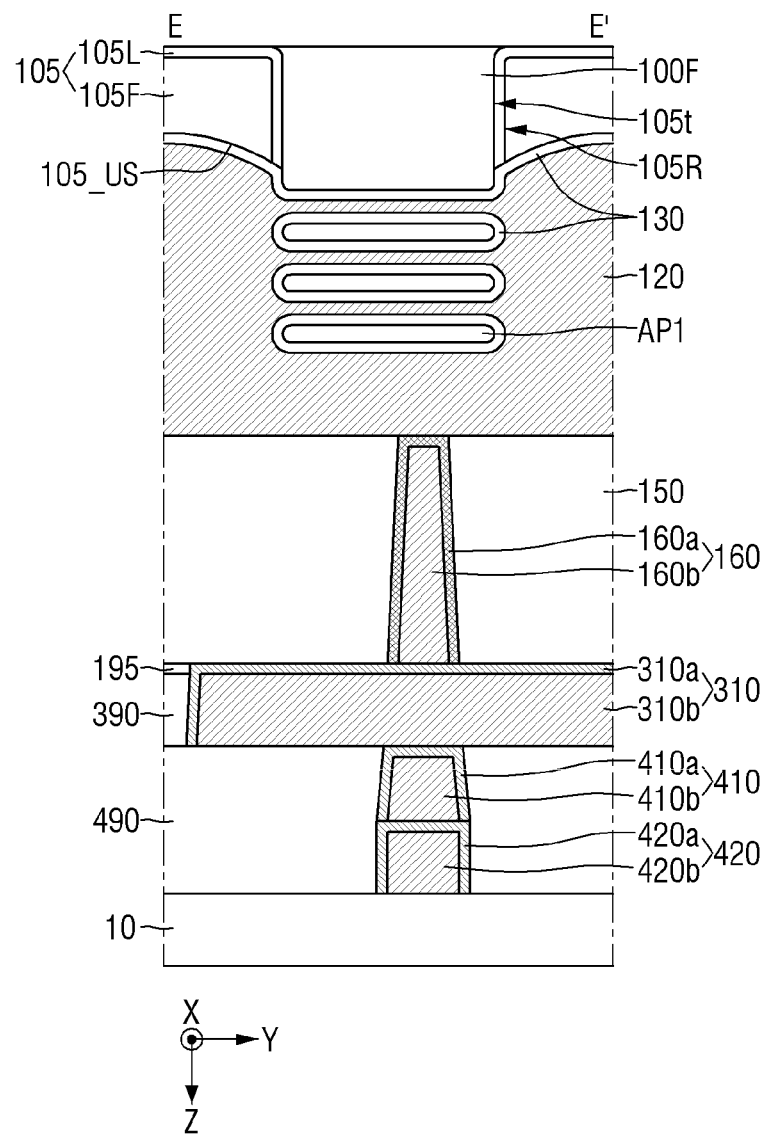

Referring to FIGS. 24 through 26, the first lower substrate 100B and the second lower substrate 200B may be removed.

The first lower substrate 100B may be removed to expose the first fin-shaped substrate 100F. The second lower substrate 200B may be removed to expose the second fin-shaped substrate 200F. The first lower substrate 100B may be removed to expose a first field insulating layer 105. The second lower substrate 200B may be removed to expose a second field insulating layer 205.

The first lower substrate 100B and the second lower substrate 200B may be removed using, e.g., a chemical mechanical polishing (CMP) process. However, the present disclosure is not limited thereto.

Figure 27:
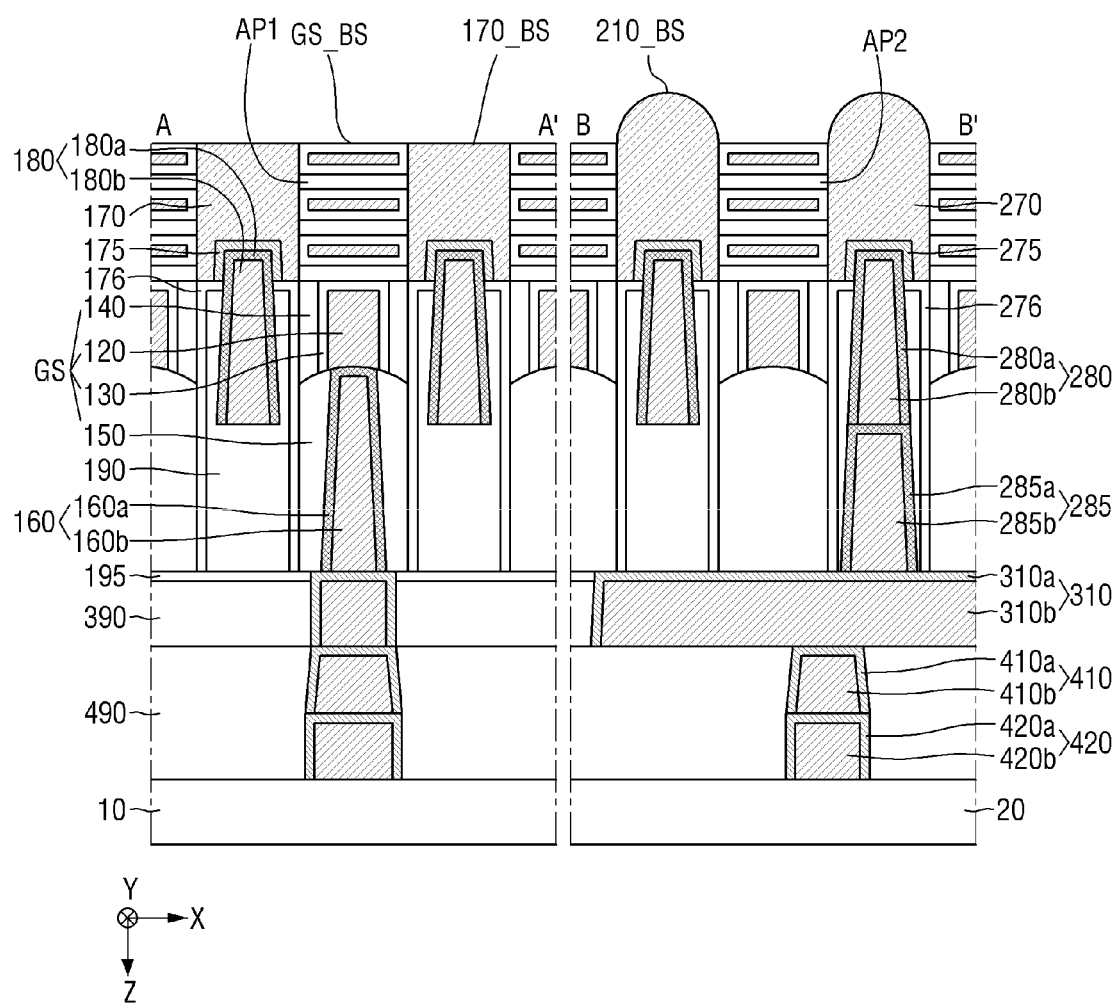
Figure 28:
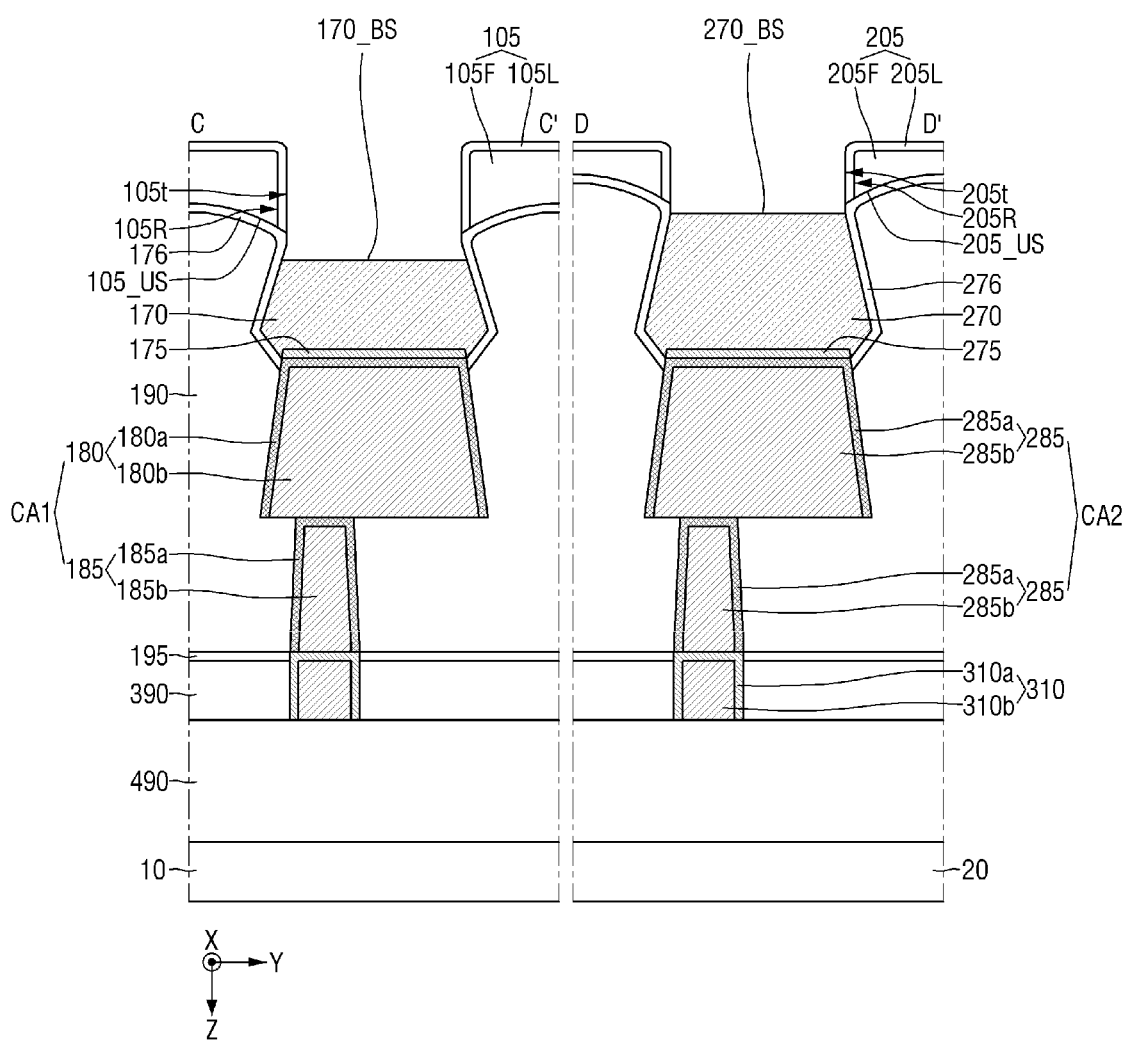
Figure 29:
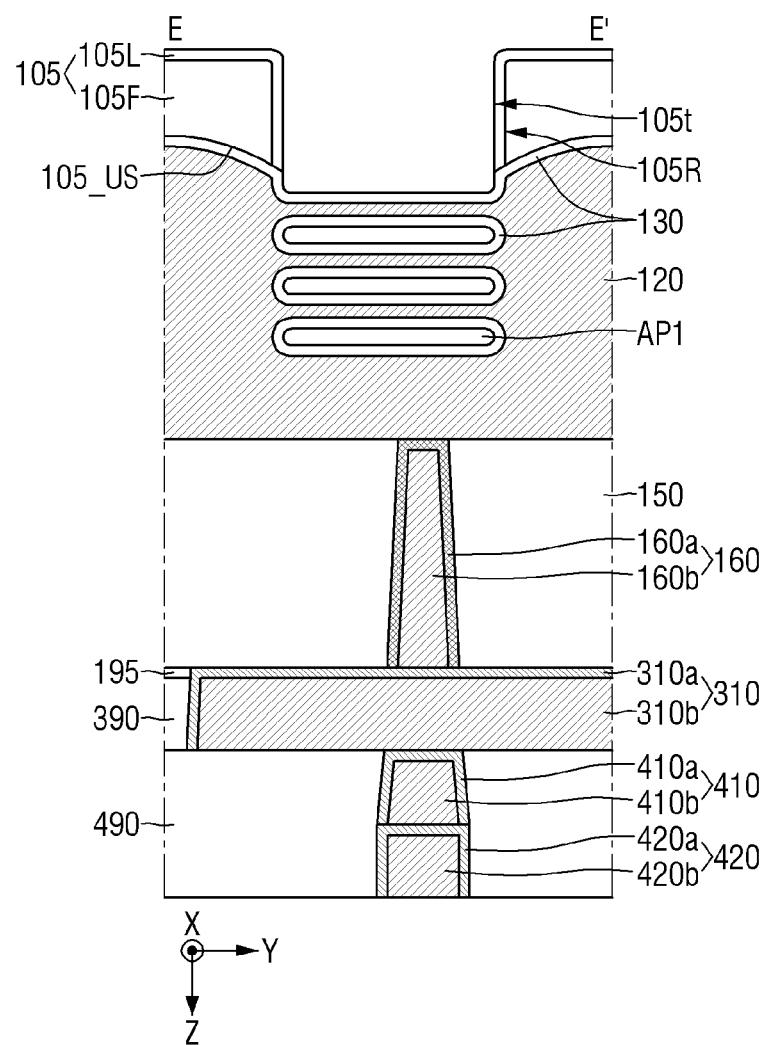

Referring to FIGS. 27 through 29, the first fin-shaped substrate 100F and the second fin-shaped substrate 200F may be removed.

The first fin-shaped substrate 100F and the second fin-shaped substrate 200F may be removed to expose the first source/drain patterns 170, the second source/drain patterns 270, and a gate insulating layer 130.

The first fin-shaped substrate 100F and the second fin-shaped substrate 200F may be removed using a dry etching process. When the first fin-shaped substrate 100F is removed, the first field insulating layer 105 may not be removed due to a difference in etch selectivity between the first fin-shaped substrate 100F and the first field insulating layer 105. Likewise, when the second fin-shaped substrate 200F is removed, the second field insulating layer 205 may not be removed due to a difference in etch selectivity between the second fin-shaped substrate 200F and the second field insulating layer 205.

In some embodiments, the first source/drain patterns 170 may be partially removed while the first fin-shaped substrate 100F is removed. On the other hand, the second source/drain patterns 270 may not be removed while the second fin-shaped substrate 200F is removed.

Due to a difference in properties between a material included in the first source/drain patterns 170 and a material included in the second source/drain patterns 270, the second source/drain patterns 270 may not be removed. However, the present disclosure is not limited thereto.

Unlike in the drawings, the first lower substrate 100B and the first fin-shaped substrate 100F may not be removed using a separate process. The first lower substrate 100B and the first fin-shaped substrate 100F may also be simultaneously removed. In this case, the first substrate 100 may be removed using a dry etching process.

Likewise, the second lower substrate 200B and the second fin-shaped substrate 200F may not be removed using a separate process. The second lower substrate 200B and the second fin-shaped substrate 200F may also be simultaneously removed. In this case, the second substrate 200 may be removed using a dry etching process.

Figure 30:
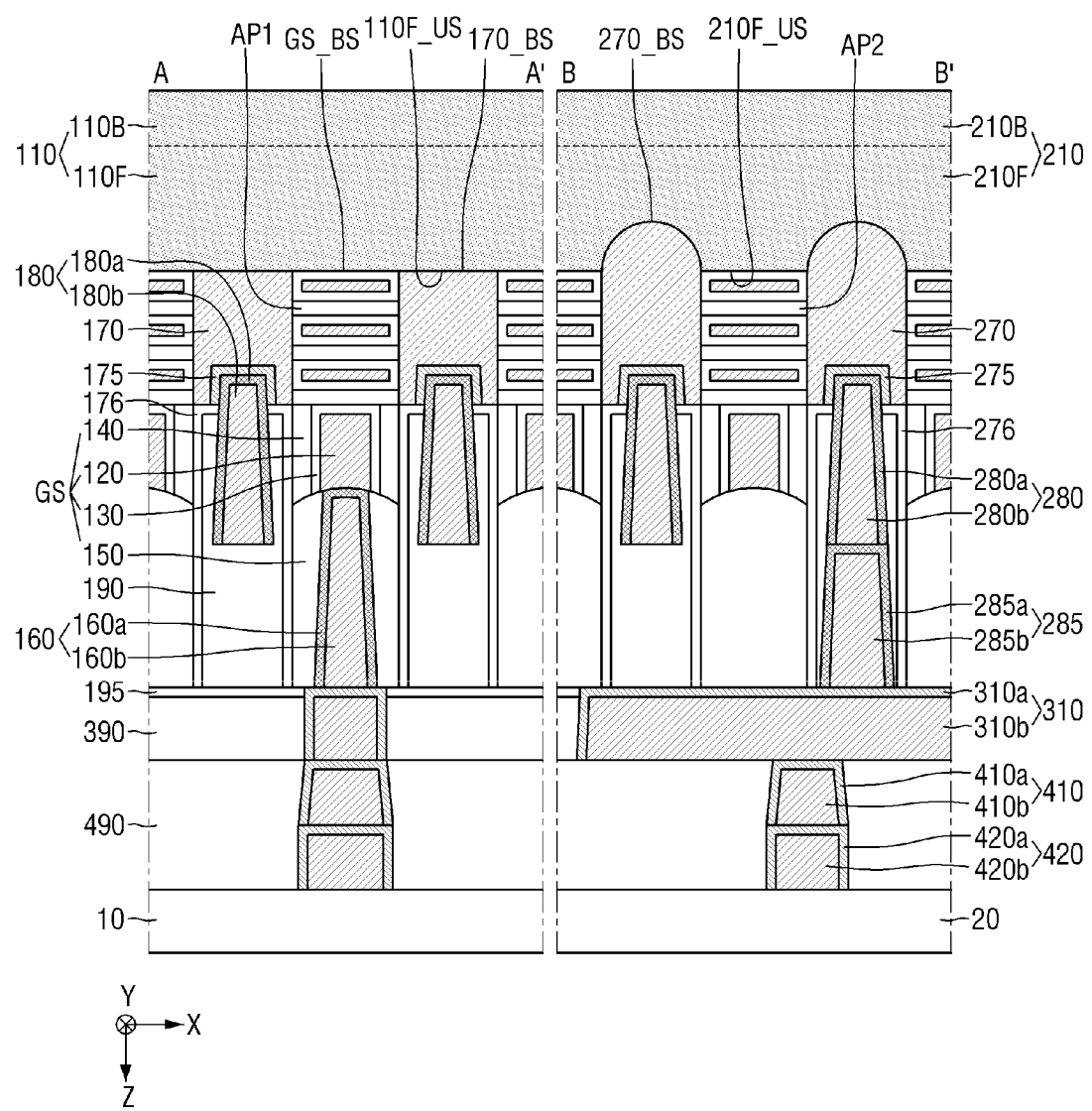
Figure 31:
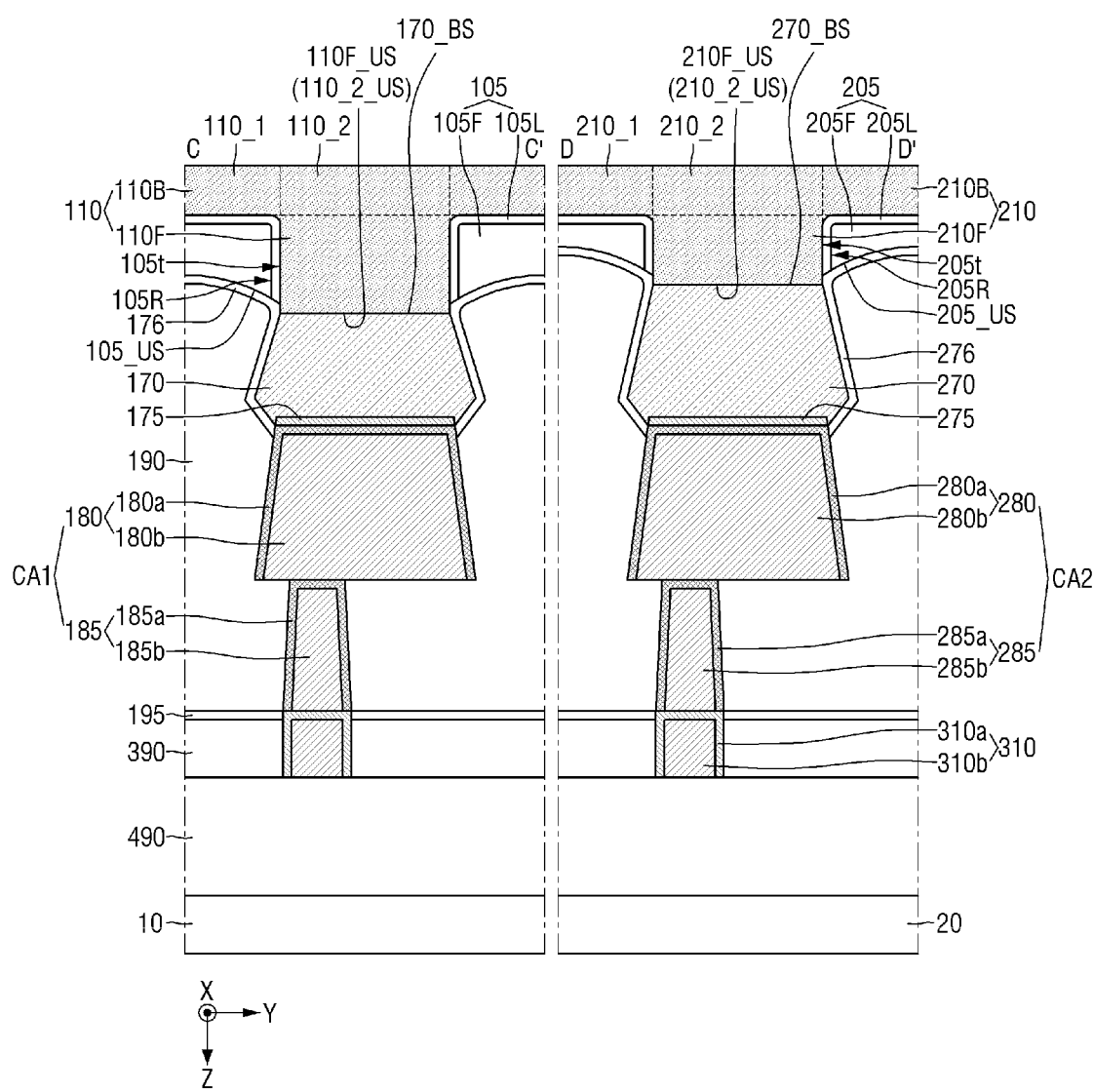
Figure 32:
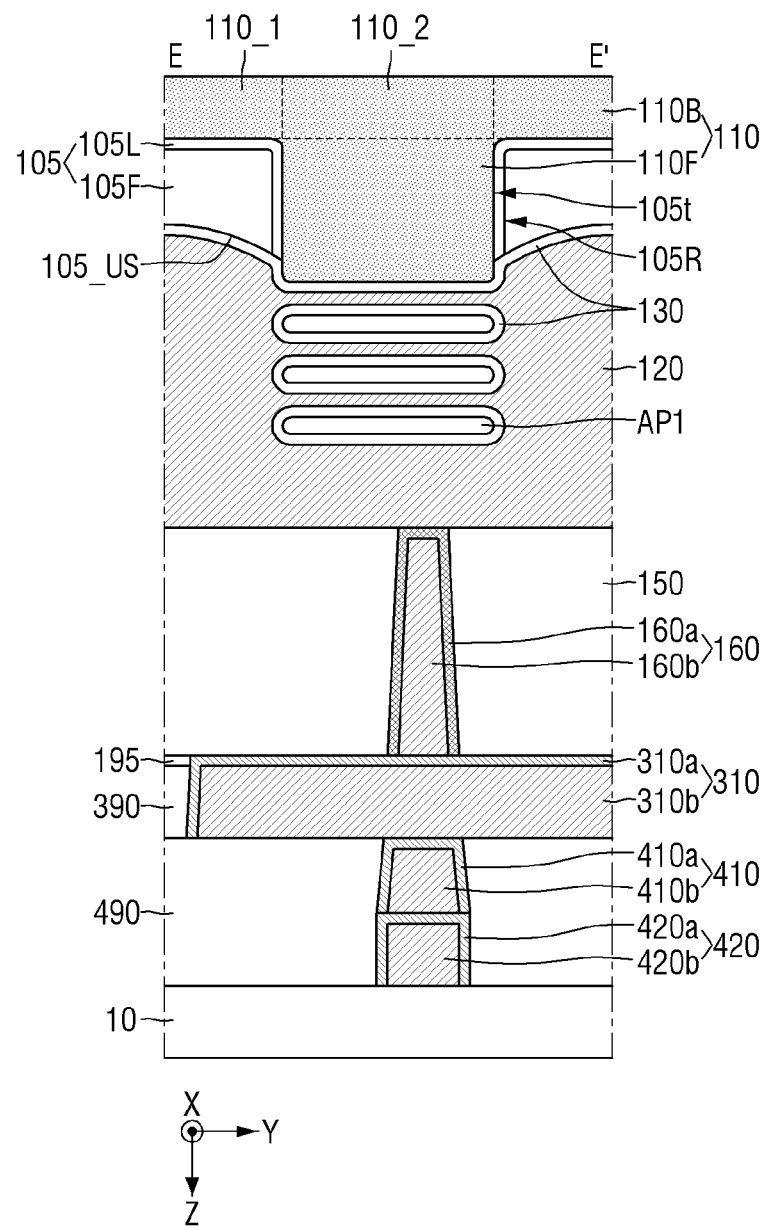

Referring to FIGS. 30 through 32, the first insulating layer 110 may be formed on the first source/drain patterns 170 and the first field insulating layer 105.

The second insulating layer 210 may be formed on the second source/drain patterns 270 and the second field insulating layer 205.

The first insulating layer 110 may include a first fin-shaped insulating layer 110F and a first lower insulating layer 110B. The first fin-shaped insulating layer 110F may be a part overlapping the first field insulating layer 105 in the second direction Y. The first lower insulating layer 110B may be a part not overlapping the first field insulating layer 105 in the second direction Y.

The second insulating layer 210 may include a second fin-shaped insulating layer 210F and a second lower insulating layer 210B. The second fin-shaped insulating layer 210F may be a part overlapping the second field insulating layer 205 in the second direction Y. The second lower insulating layer 210B may be a part not overlapping the second field insulating layer 205 in the second direction Y.

Figure 33:
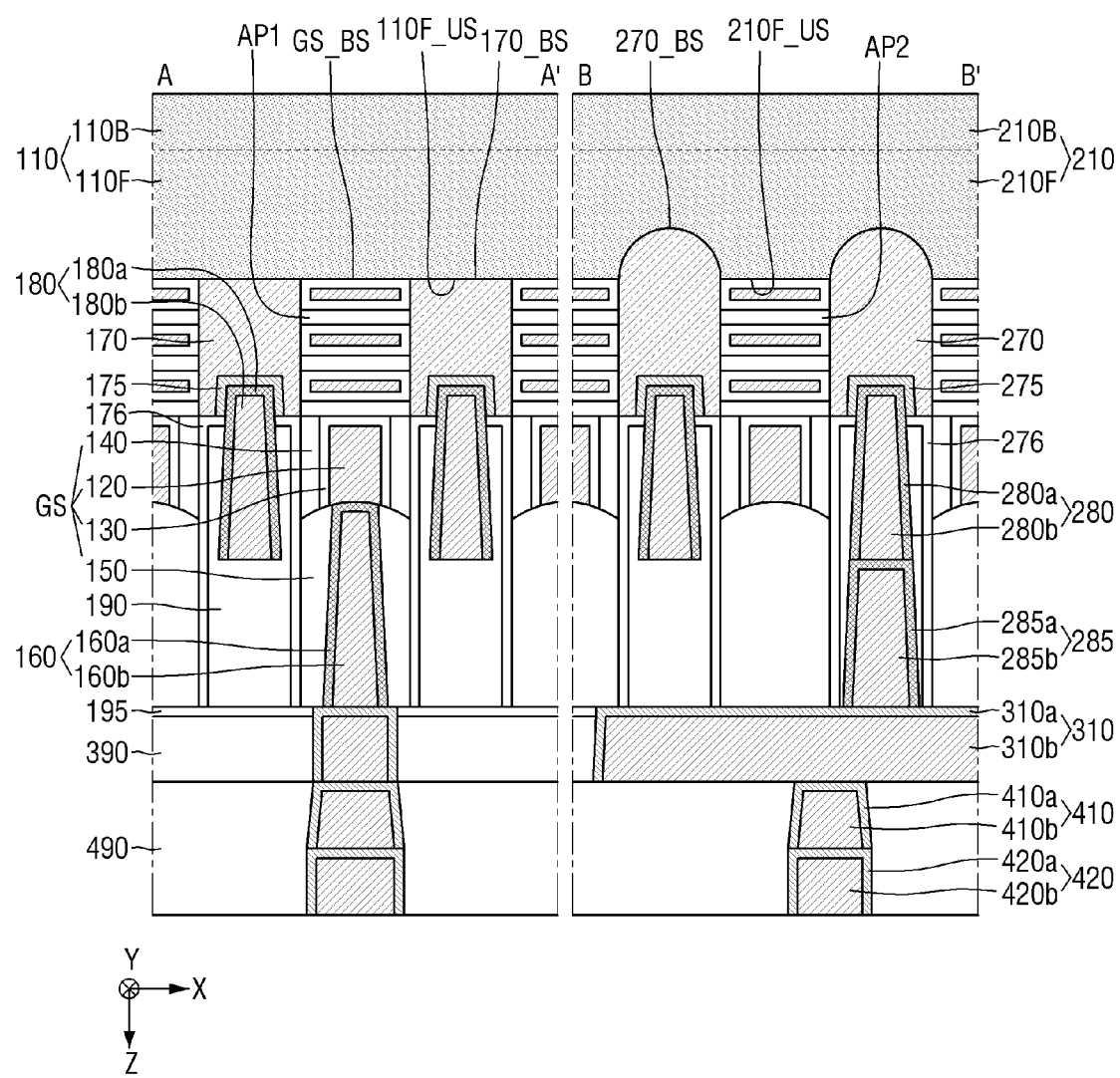
Figure 34:
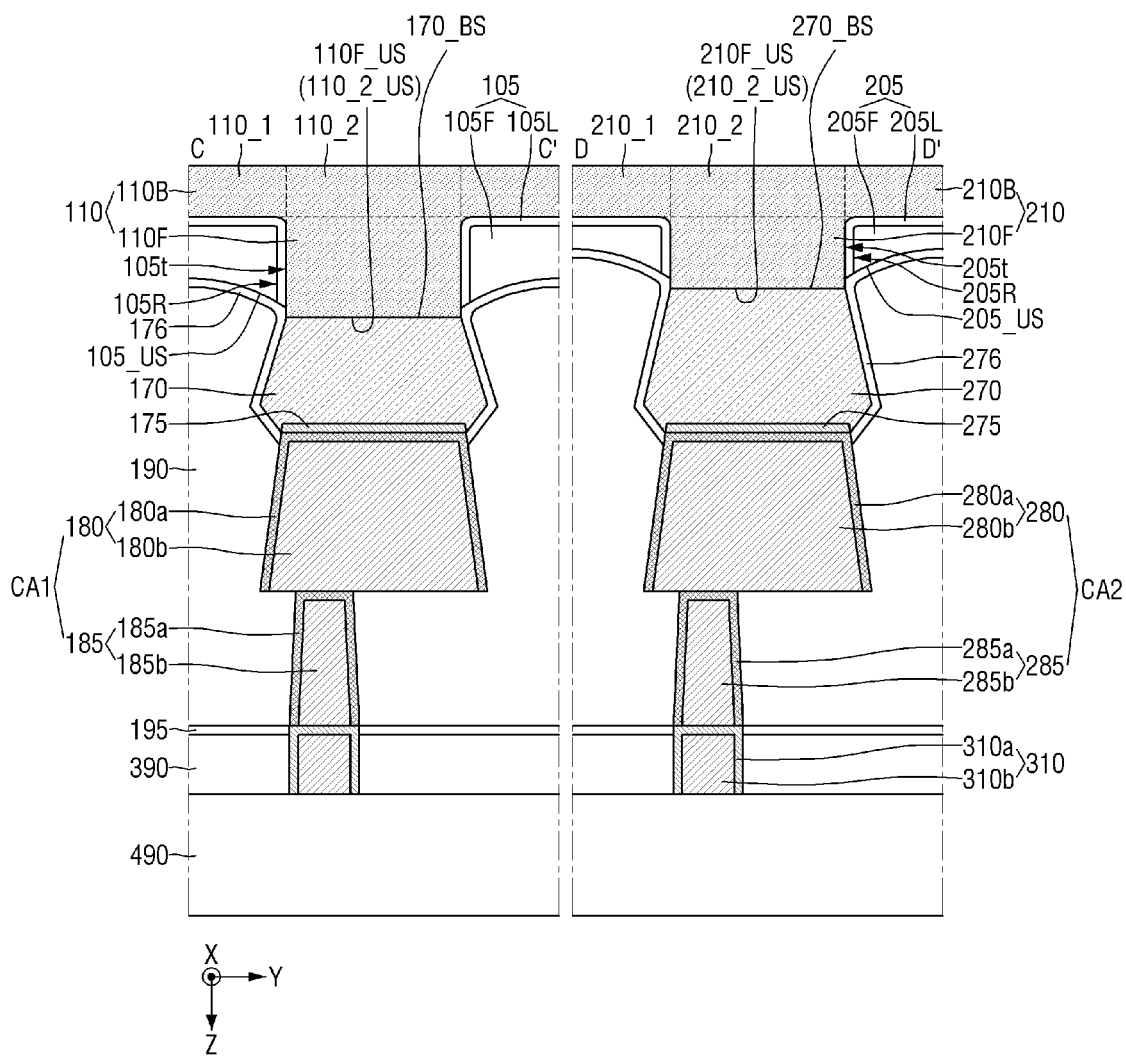
Figure 35:
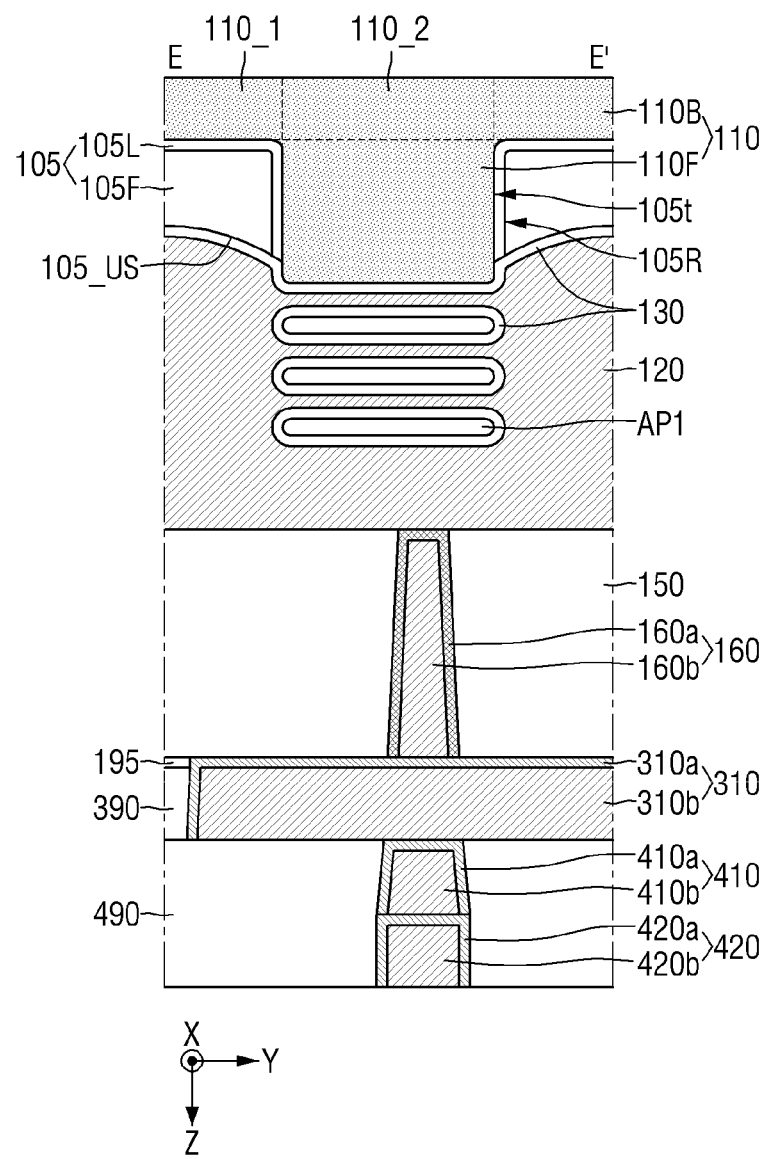

Referring to FIGS. 33 through 35, the first support substrate 10 and the second support substrate 20 may be removed.

Although not illustrated, after the first support substrate 10 and the second support substrate 20 are removed, the resultant structure is rotated 180 degrees to complete the semiconductor device according to the embodiments of the present disclosure.

In concluding the detailed description, those skilled in the art will appreciate that many variations and modifications may be made to the example embodiments without substantially departing from the scope of the present invention. Therefore, the disclosed example embodiments of the disclosure are used in a generic and descriptive sense only and not for purposes of limitation.

What is claimed is:

1. A semiconductor device comprising:
   a lower insulating layer;
   a fin-shaped insulating layer that is on the lower insulating layer and vertically protrudes upward beyond an upper surface of the lower insulating layer, the fin-shaped insulating layer extending in a first direction;
   a field insulating layer that is on the lower insulating layer and extends in the first direction;
   a plurality of gate structures that are on the fin-shaped insulating layer and comprise a gate electrode intersecting the fin-shaped insulating layer;
   a source/drain region that is on the fin-shaped insulating layer and is between the gate structures; and
   an active pattern that is on the fin-shaped insulating layer and penetrates the gate electrode and is electrically connected to the source/drain region,
   wherein the gate electrode extends in a second direction intersecting the first direction,
   wherein at least a part of the source/drain region overlaps the fin-shaped insulating layer in the first direction, and
   wherein a bottom surface of the active pattern is coplanar with or higher than an upper surface of the fin-shaped insulating layer, with the upper surface of the lower insulating layer providing a base reference plane.

2. The semiconductor device of claim 1, wherein the source/drain region comprises a first source/drain region,
   wherein the semiconductor device further comprises a second source/drain region adjacent to the first source/drain region in the second direction, and
   wherein a bottom surface of the second source/drain region is higher than a bottom surface of at least one of the gate structures relative to the upper surface of the lower insulating layer.

3. The semiconductor device of claim 1, wherein the field insulating layer comprises a field liner layer that defines a field recess and a field filling layer that is on the field liner layer and in the field recess.

4. The semiconductor device of claim 3,
   wherein the field liner layer comprises a horizontal part that defines a bottom surface of the field recess and a vertical part that defines sidewalls of the field recess, and
   wherein the horizontal part of the field liner layer contacts the lower insulating layer, and the vertical part of the field liner layer contacts the fin-shaped insulating layer.

5. The semiconductor device of claim 1, wherein an upper surface of the field insulating layer is convex with respect to the upper surface of the lower insulating layer.

6. The semiconductor device of claim 1, wherein the fin-shaped insulating layer comprises a first fin-shaped insulating layer,
   wherein the semiconductor device further comprises a second fin-shaped insulating layer adjacent to the first fin-shaped insulating layer in the second direction, and wherein at least a part of the second fin-shaped insulating layer overlaps the gate structures in the first direction.

7. The semiconductor device of claim 1,
wherein the lower insulating layer and the fin-shaped insulating layer comprise a same oxide-based insulating material,
wherein the source/drain region and the active pattern each comprise a semiconductor material,
wherein a bottom surface of the source/drain region contacts a first portion of the upper surface of the fin-shaped insulating layer,
wherein a second portion of the upper surface of the fin-shaped insulating layer contacts a bottom surface of another source/drain region, and
wherein a third portion of the upper surface of the fin-shaped insulating layer contacts a bottom surface of a first gate structure of the plurality of gate structures that is between the source/drain region and the other source/drain region.

8. The semiconductor device of claim 1, wherein the active pattern comprises a first active pattern of a plurality of active patterns that are spaced apart from each other in a third direction intersecting the first direction and the second direction, and
wherein the fin-shaped insulating layer vertically protrudes upward beyond the upper surface of the lower insulating layer in the third direction.

9. The semiconductor device of claim 1, wherein the active pattern does not directly contact the fin-shaped insulating layer, and
wherein the fin-shaped insulating layer directly contacts the lower insulating layer.

10. The semiconductor device of claim 1, wherein the source/drain region comprises a first source/drain region, and the fin-shaped insulating layer comprises a first fin-shaped insulating layer,
wherein the semiconductor device further comprises:
a second source/drain region adjacent to the first source/drain region in the second direction; and
a second fin-shaped insulating layer adjacent to the first fin-shaped insulating layer in the second direction, and
wherein the second source/drain region does not overlap the second fin-shaped insulating layer in the first direction.

11. The semiconductor device of claim 1, wherein an upper surface of the field insulating layer is lower than the upper surface of the fin-shaped insulating layer, with the upper surface of the lower insulating layer providing the base reference plane.

12. A semiconductor device comprising:
an insulating layer;
a trench that is in the insulating layer and extends in a first direction;
a field insulating layer that is in the trench;
a gate electrode that is on the insulating layer and extends in a second direction intersecting the first direction;
a source/drain region that is on the insulating layer beside the gate electrode; and
an active pattern that penetrates the gate electrode and is electrically connected to the source/drain region,
wherein the insulating layer comprises a first part overlapping the field insulating layer in a third direction intersecting the first direction and the second direction and a second part not overlapping the field insulating layer in the third direction,
wherein the second part of the insulating layer protrudes upward in the third direction beyond an upper surface of the first part of the insulating layer,
wherein a bottom surface of the source/drain region contacts the second part of the insulating layer, and
wherein the source/drain region does not overlap the second part of the insulating layer in the first direction.

13. The semiconductor device of claim 12,
wherein the field insulating layer comprises a field liner layer in the trench and a field filling layer that is on the field liner layer, and
wherein a sidewall of the second part of the insulating layer contacts the field liner layer.

14. The semiconductor device of claim 12, wherein the insulating layer comprises an oxide-based insulating material, and
wherein the source/drain region and the active pattern each comprise a semiconductor material.

15. The semiconductor device of claim 12, wherein the bottom surface of the source/drain region is coplanar with a bottom surface of the active pattern.

16. A semiconductor device comprising:
a lower insulating layer comprising a first region and a second region;
a first fin-shaped insulating layer on the first region of the lower insulating layer and vertically protruding from the first region of the lower insulating layer, the first fin-shaped insulating layer extending in a first direction;
a second fin-shaped insulating layer on the second region of the lower insulating layer and vertically protruding from the second region of the lower insulating layer, the second fin-shaped insulating layer extending in the first direction;
a plurality of gate structures that are on the first and second fin-shaped insulating layers and comprise a gate electrode intersecting the first and second fin-shaped insulating layers;
a first source/drain region that is on the first fin-shaped insulating layer,
a second source/drain region that is on the second fin-shaped insulating layer;
a first active pattern that is on the first fin-shaped insulating layer and penetrates the gate electrode and is electrically connected to the first source/drain region; and
a second active pattern that is on the second fin-shaped insulating layer and penetrates the gate electrode and is electrically connected to the second source/drain region,
wherein the gate electrode extends in a second direction intersecting the first direction,
wherein a bottom surface of the first source/drain region is higher than a bottom surface of the second source/drain region relative to an upper surface of the lower insulating layer, and
wherein the first source/drain region does not overlap the first fin-shaped insulating layer in the first direction, and at least a part of the second source/drain region overlaps the second fin- shaped insulating layer in the first direction.

17. The semiconductor device of claim 16, wherein a height of the first fin-shaped insulating layer is greater than a height of the second fin-shaped insulating layer.

18. The semiconductor device of claim 16, wherein the second source/drain region comprises silicon germanium (SiGe).

19. The semiconductor device of claim 16, wherein the first source/drain region includes a different material from the second source/drain region.

20. The semiconductor device of claim 16, wherein the bottom surface of the first source/drain region is coplanar with a bottom surface of at least one of the gate structures.

* * * * *